United States Patent
Tanaka et al.

(10) Patent No.: US 9,627,232 B2
(45) Date of Patent: Apr. 18, 2017

(54) SUBSTRATE PROCESSING METHOD, SUBSTRATE PROCESSING APPARATUS AND NON-TRANSITORY STORAGE MEDIUM

(71) Applicant: TOKYO ELECTRON LIMITED, Tokyo (JP)

(72) Inventors: Keiichi Tanaka, Nirasaki (JP); Kousuke Yoshihara, Koshi (JP); Tomohiro Iseki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 314 days.

(21) Appl. No.: 14/246,714

(22) Filed: Apr. 7, 2014

(65) Prior Publication Data
US 2014/0299161 A1 Oct. 9, 2014

(30) Foreign Application Priority Data

Apr. 4, 2013 (JP) .................. 2013-078515

(51) Int. Cl.
- *B08B 3/02* (2006.01)
- *B08B 5/00* (2006.01)
- *B08B 5/02* (2006.01)
- *H01L 21/67* (2006.01)
- *G03F 7/30* (2006.01)

(52) U.S. Cl.
CPC ........ *H01L 21/67051* (2013.01); *B08B 3/024* (2013.01); *B08B 5/00* (2013.01); *G03F 7/3021* (2013.01); *H01L 21/67028* (2013.01); *H01L 21/67034* (2013.01)

(58) Field of Classification Search
CPC .......... H01L 21/0206; H01L 21/67051; H01L 21/67028; H01L 21/67034; G03F 7/3021; B08B 5/00; B08B 5/02; B08B 3/024

USPC ......... 134/30, 32, 33, 34, 36, 37, 94.1, 95.1, 134/95.2, 95.3, 102.2
See application file for complete search history.

(56) References Cited

U.S. PATENT DOCUMENTS

2008/0133045 A1* 6/2008 Hontake .......... H01L 21/67225
700/121
2008/0274433 A1* 11/2008 Takaki .................. G03F 7/3021
430/325

FOREIGN PATENT DOCUMENTS

| JP | 1992323658 A | 11/1992 |
| JP | 2004336081 A | 11/2004 |
| JP | 2008098598 A | 4/2008 |

(Continued)

*Primary Examiner* — Saeed T Chaudhry
(74) *Attorney, Agent, or Firm* — Nath Goldberg & Meyer; Jerald L. Meyer

(57) ABSTRACT

There is provided a substrate processing method including: supplying a developing liquid to a surface of an exposed substrate to form a resist pattern; supplying a cleaning liquid to the surface of the substrate to remove a residue generated in the developing step from the substrate; supplying a replacing liquid to the surface of the substrate to replace the cleaning liquid existing on the substrate with the replacing liquid, the replacing liquid having a surface tension of 50 mN/m or less and containing a percolation inhibitor for restraining the replacing liquid from percolating into a resist wall portion constituting the resist pattern; and forming a dry region by supplying a gas to a central portion of the substrate while rotating the substrate so as to dry the surface of the substrate by expanding the dry region to a peripheral edge portion of the substrate with a centrifugal force.

9 Claims, 35 Drawing Sheets

(56) References Cited

FOREIGN PATENT DOCUMENTS

| JP | 4455228 | B2 | 2/2010 |
|---|---|---|---|
| JP | 4504229 | B2 | 4/2010 |
| JP | 2010256849 | A | 11/2010 |
| JP | 2012211949 | A | 11/2012 |

\* cited by examiner

FIG. 8
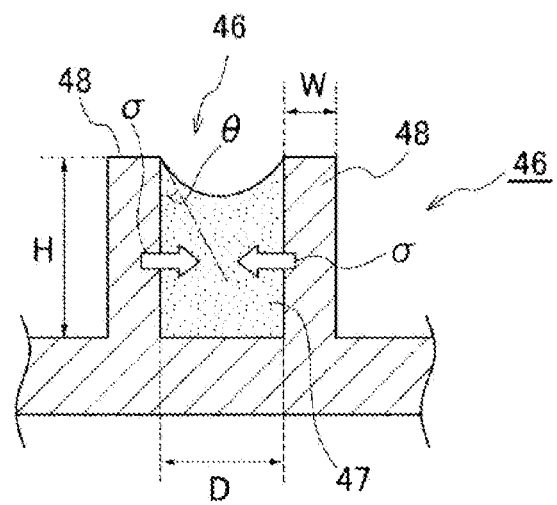
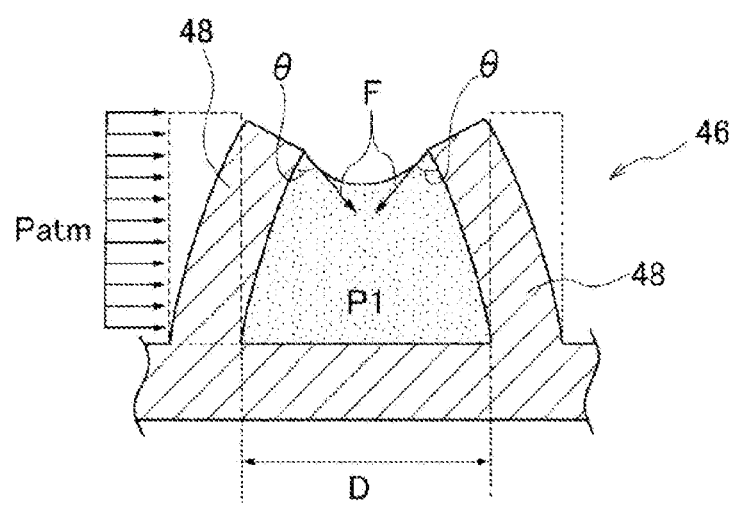

3-2

7-2

SUBSTRATE PROCESSING METHOD, SUBSTRATE PROCESSING APPARATUS AND NON-TRANSITORY STORAGE MEDIUM

CROSS-REFERENCE TO RELATED APPLICATION

This application claims the benefit of Japanese Patent Application No. 2013-078515, filed on Apr. 4, 2013, in the Japan Patent Office, the disclosure of which is incorporated herein in its entirety by reference.

TECHNICAL FIELD

The present disclosure relates to a substrate processing method and an apparatus which processes a developed substrate having resist patterns formed thereon and a non-transitory storage medium which includes a computer program configured to execute the substrate processing method.

BACKGROUND

In a photolithography process for a semiconductor wafer (hereinafter referred to as a "wafer"), a resist film is formed on the surface of the wafer and is exposed with predetermined patterns. Thereafter, the resist film is developed to form a resist pattern on the resist film. In order to remove a resist residue generated during the developing process, a cleaning liquid is supplied to the wafer to clean the wafer. After supplying the cleaning liquid, the cleaning liquid on the surface of the wafer is removed by rotating the wafer. As a result, the wafer is dried.

For example, pure water is used as a cleaning liquid. Since the pure water has a relatively large surface tension, the resist pattern collapses, namely from the destruction of wall portions constituting the patterns. This may occur due to the capillary phenomenon generated in removing a cleaning liquid between the resist patterns. In order to suppress the pattern collapse, a liquid relatively low in surface tension (referred to as a "low-surface-tension liquid") containing a surfactant is supplied to a wafer after the pure water is supplied. The removing process is performed while replacing the pure water between the patterns with the low-surface-tension liquid.

However, it is known that the surfactant contained in the low-surface-tension liquid percolates into the space between the resist patterns causing the resist to swell, thereby resulting in a change in the CD (Critical Dimension) which is the line width of the resist patterns. It has been determined that fine resist patterns may be formed by EUVL (extreme ultraviolet lithography), i.e., a lithography in which exposure is performed using extreme ultraviolet radiation (EUV). Under these circumstances, a technology capable of suppressing the pattern collapse and then additionally minimizing the change in the CD is needed. Meanwhile, a hole may be formed in a layer of a cleaning liquid on the substrate surface by supplying a gas to the central region of a rotating substrate, and the substrate may be dried by enlarging the hole. However, this method cannot also solve the aforementioned problem.

SUMMARY

Some embodiments of the present disclosure provide a technology capable of suppressing the destruction of wall portions which form resist patterns and suppress a change in the line width of the resist patterns when cleaning a developed substrate.

According to one embodiment of the present disclosure, a substrate processing method includes: supplying a developing liquid to a surface of an exposed substrate so as to form a resist pattern; supplying a cleaning liquid to the surface of the substrate so as to remove a residue generated in the developing step from the substrate; supplying a replacing liquid to the surface of the substrate so as to replace the cleaning liquid existing on the substrate with the replacing liquid, the replacing liquid having a surface tension of 50 mN/m or less and containing a percolation inhibitor for restraining the replacing liquid from percolating into a resist wall portion constituting the resist pattern; and forming a dry region by supplying a gas to a central portion of the substrate while rotating the substrate so as to dry the surface of the substrate by expanding the dry region to a peripheral edge portion of the substrate with a centrifugal force.

According to another embodiment of the present disclosure, a substrate processing apparatus includes: a holding unit configured to hold a substrate provided with a developed resist pattern on a surface thereof and to rotate the substrate around a vertical axis; a cleaning liquid supply unit configured to supply a cleaning liquid to the surface of the substrate; a replacing liquid supply unit configured to supply to the surface of the substrate a replacing liquid which has a surface tension of 50 mN/m or less and contains a percolation inhibitor for restraining the replacing liquid from percolating into a resist wall portion constituting the resist pattern; a gas supply unit configured to supply a gas to a central portion of the substrate; and a control unit configured to output control signals so as to control operations of the holding unit, the cleaning liquid supply unit, the replacing liquid supply unit and the gas supply unit. The control unit is configured to output control signals so as supply the cleaning liquid to the surface of the substrate in order to remove a residue generated during a developing process, supply the replacing liquid to the surface of the substrate in order to replace the cleaning liquid existing on the surface of the substrate with the replacing liquid, form a dry region by supplying a gas to the central portion of the substrate while rotating the substrate, and dry the surface of the substrate by expanding the dry region to a peripheral edge portion of the substrate with a centrifugal force.

According to another embodiment of the present disclosure, provided is a non-transitory storage medium, which stores a computer program for use in a substrate processing apparatus configured to clean a substrate provided with a developed and patterned resist film on a surface thereof. The program causes the computer to perform the aforementioned substrate processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a schematic view of the resist pattern.

DETAILED DESCRIPTION

Figure 1:
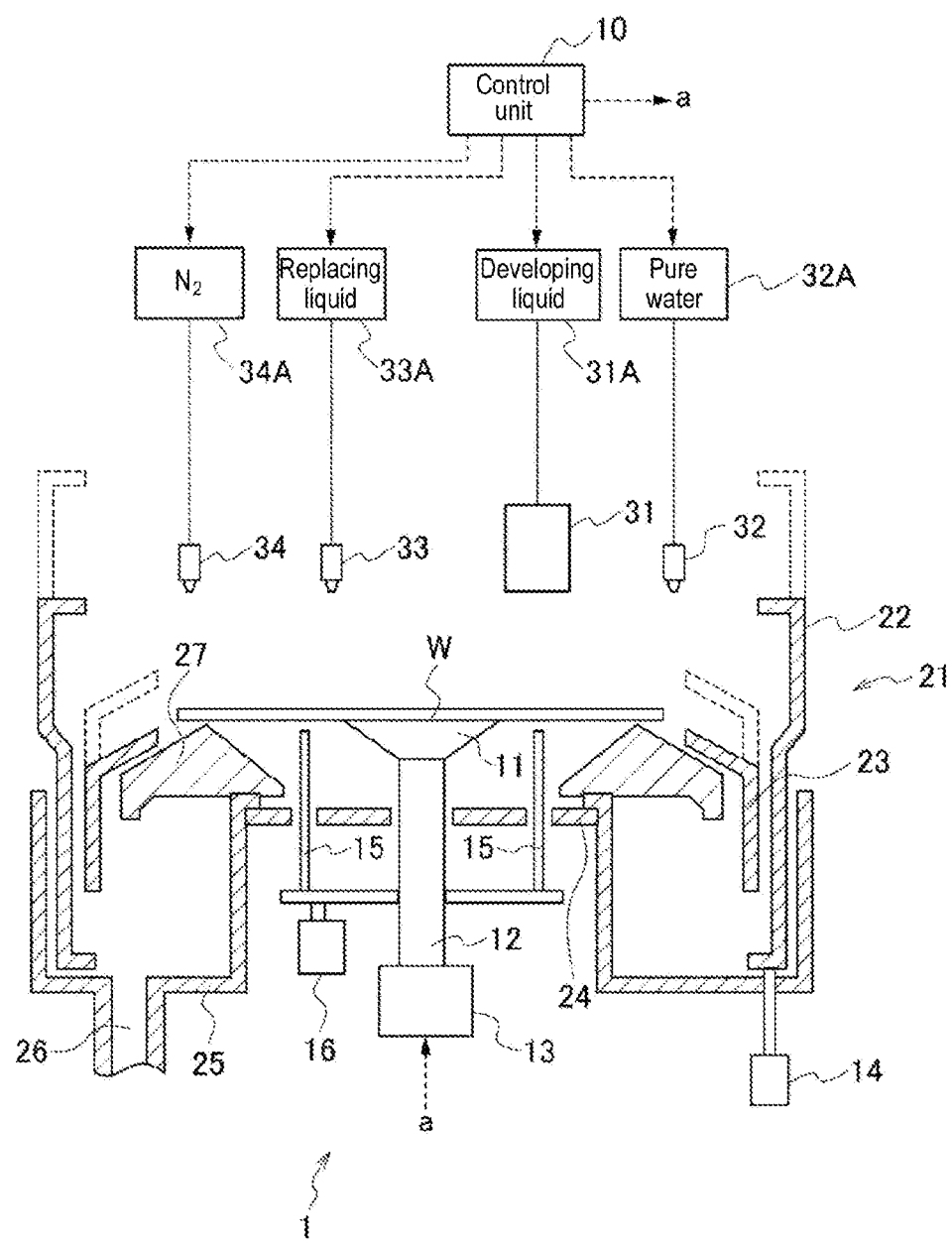
FIG. 1 is a vertical sectional view of a developing apparatus according to one embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A developing apparatus 1 which constitutes a substrate processing apparatus of the present disclosure will now be described with reference to a vertical sectional view shown in FIG. 1 and a horizontal sectional view shown in FIG. 2. A wafer W is transferred to the developing apparatus 1 by a substrate transfer mechanism not shown. A resist film is formed on the surface of the wafer W. The resist film is exposed along predetermined patterns.

In the figures, reference symbol 11 designates a spin chuck as a substrate holding unit for attracting the central region of the rear surface of the wafer W and holding the wafer W in a horizontal posture. The spin chuck 11 is connected to a rotating mechanism 13 through a rotation shaft 12 and is configured to rotate while holding the wafer W. A cup body 21 opened upward is installed so as to surround the wafer W placed on the spin chuck 11. The cup body 21 includes, e.g., an outer cup 22 having a rectangular upper portion and a cylindrical lower portion, and a tubular inner cup 23 having an inwardly-inclined upper portion. The outer cup 22 is moved up and down by an elevator unit 14 connected to the lower end portion of the outer cup 22. The inner cup 23 is configured to move up and down in such a way that the inner cup 23 is pushed up by a shoulder portion formed on the inner circumferential surface of the lower end portion of the outer cup 22.

A circular plate 24 is installed below the spin chuck 11. A liquid receiving unit 25 having a concave section is installed outside the circular plate 24 along the entire circumference. A drain hole 26 is formed on the bottom surface of the liquid receiving unit 25. The liquid receiving unit 25 retains various liquids dropped or centrifugally removed from the wafer W. These liquids are drained out of the developing apparatus 1 through the drain hole 26.

A ring member 27 having a cone-shaped section is installed outside the circular plate 24. Three lift pins 15 (only two of which are shown in FIG. 1) are installed to penetrate the circular plate 24 and are moved up and down by an elevator mechanism 16. The wafer W is delivered between the substrate transfer mechanism and the spin chuck 11 by way of the lift pins 15.

The developing apparatus 1 includes a developing liquid nozzle 31, a cleaning liquid nozzle 32, a replacing liquid nozzle 33 and a gas nozzle 34. The developing liquid nozzle 31 is provided with a slit-shaped discharge hole 31a extending in the radial direction of the wafer W held by the spin chuck 11. The developing liquid nozzle 31 is connected to a developing liquid supply system 31A.

The cleaning liquid nozzle 32 is provided with an elongated discharge hole and is configured to discharge pure water as a cleaning liquid. The cleaning liquid nozzle 32 is connected to a cleaning liquid supply system 32A as a cleaning liquid supply unit. The replacing liquid nozzle 33 is provided with a discharge hole as an elongated hole and is configured to discharge a replacing liquid. The replacing liquid is used to replace the pure water existing on the surface of the wafer W. The replacing liquid has a surface tension of 50 mN/m or less. The replacing liquid contains a surfactant for reducing the surface tension to the aforementioned value and a percolation inhibitor for preventing the replacing liquid from percolating into a resist. The percolation inhibitor may be a basic nitrogen compound. The replacing liquid nozzle 33 is connected to a replacing liquid supply system 33A as a replacing liquid supply unit.

The liquid supply systems 31A, 32A and 33A are respectively provided with supply sources and supply controllers for the respective liquids discharged from the nozzles 31, 32 and 33. The gas nozzle 34 is provided with an elongated discharge hole in the lower end portion thereof and is configured to discharge an inert gas, e.g., $N_2$ (nitrogen) gas. As described later, in order to form a dry region 30, when discharging a gas to the wafer W, the height from the surface of the wafer W to the discharge hole is set to 25 mm or less. The gas nozzle 34 is connected to a gas supply system 34A as a gas supply unit. The gas supply system 34A includes a gas supply source, a supply controller, and so forth. The supply controllers constituting the liquid supply systems 31A to 33A and the gas supply system 34A include pumps and valves configured to regulate the discharge flow rates of the liquids or the gas.

For instance, the developing liquid nozzle 31 and the cleaning liquid nozzle 32 are supported by one end portion of a nozzle arm 35A as a support member. The other end of the nozzle arm 35A is connected to a moving mechanism 36A. The moving mechanism 36A is configured to move the nozzle arm 35A up and down and is configured to move along the longitudinal direction of a guide rail 37A. In a plan view, the guide rail 37A horizontally extends so as to orthogonally intersect the nozzle arm 35A. With this configuration, the developing liquid nozzle 31 can supply a developing liquid along the diameter of the wafer W. The cleaning liquid nozzle 32 can supply a cleaning liquid to the central region of the wafer W.

For example, the replacing liquid nozzle 33 and the gas nozzle 34 are supported by one end portion of a nozzle arm 35B as a support member. The other end of the nozzle arm 35B is connected to a moving mechanism 36B. The moving mechanism 36B is configured to move the nozzle arm 35B up and down and is configured to move along the longitudinal direction of a guide rail 37B. The guide rail 37B extends parallel to the guide rail 37A. The nozzle arm 35B extends parallel to the nozzle arm 35A. With this configuration, the replacing liquid nozzle 33 and the gas nozzle 34 can supply a replacing liquid and a $N_2$ gas to the central region of the wafer W. In FIG. 2, reference symbol 38A designates a standby region for the developing liquid nozzle 31 and the cleaning liquid nozzle 32. Reference symbol 38B designates a standby region for the replacing liquid nozzle 33 and the gas nozzle 34. The respective nozzles 31 to 34 wait in the standby regions 38A and 38B when the processing of the wafer W is not performed.

Figure 2:
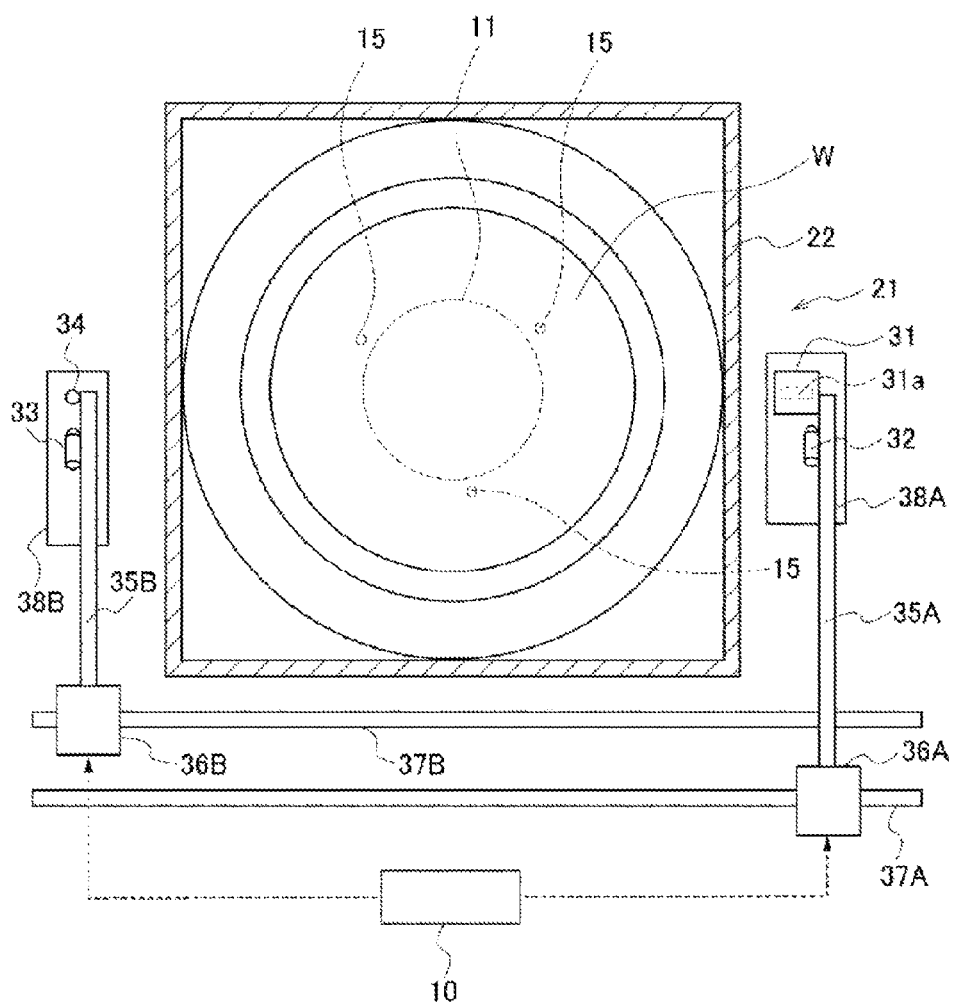
FIG. 2 is a horizontal sectional view of the developing apparatus.

In FIG. 1, reference symbol 10 designates a control unit including a computer. The control unit 10 is provided with a program for executing individual steps of the below-mentioned operation performed by the developing apparatus 1. Based on the program, the control unit 10 outputs control signals that control the operations of the moving mechanisms 36A and 36B for moving the respective nozzles 31 to 34, the operations of the supply systems 31A to 33A for discharging the respective liquids from the respective nozzles 31 to 34, the operation of the supply system 34A for discharging the gas from the gas nozzle 34, and the operation of the rotating mechanism 13 for rotating the wafer. The program is stored in a computer-readable storage medium such as a hard disk, a compact disk, a flash memory, a flexible disk, a memory card, and so forth. When in use, the program is installed from the storage medium into a computer.

The processing performed by the developing apparatus 1 is briefly described as follows. In the developing apparatus 1, a developing liquid is supplied to a wafer W to perform the developing process. A resist pattern is formed on a resist film of the wafer W with a pattern exposed in advance. Thereafter, as a cleaning liquid is supplied to the surface of the wafer W and the developing liquid is washed away from the wafer W, the resist residue generated in the developing process is removed from the surface of the wafer W. Then, as the replacing liquid is supplied to the surface of the wafer W, the liquid of a liquid film remaining on the surface of the wafer W is replaced from the cleaning liquid to the replacing liquid. Subsequently, under a centrifugal force generated by the rotation of the wafer W, the replacing liquid is centrifugally removed from the surface of the wafer W. Thus, the wafer W is dried. When removing the replacing liquid in this manner, a gas may be further supplied from the gas nozzle 34 as described later.

If the surface tension of the liquid within the recess portion of the resist pattern is large, when centrifugally removing the liquid, the stress applied to the side walls of the recess portion grows larger and the pattern collapses easily as previously mentioned in the background section of this disclosure. For that reason, the replacement from the cleaning liquid to the replacing liquid is carried out prior to performing the removing process. The replacing liquid 33B contains the aforementioned percolation inhibitor such that, during the replacement process, wall portions 48 do not swell due to replacing liquid percolating into the wall portions 48. However, the replacing liquid 33B is relatively high in cohesive force, therefore low in malleability on the surface of the wafer W.

Figure 3:
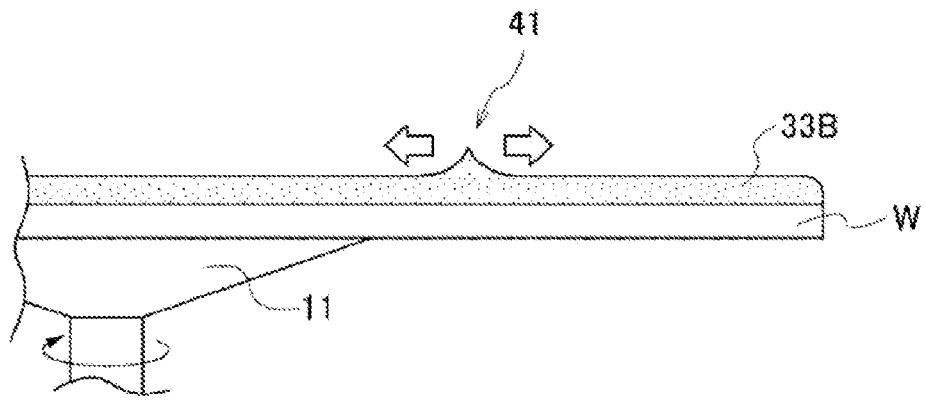
FIG. 3 is an explanatory view illustrating a behavior of a liquid on the wafer surface, which is used in the developing apparatus.
Figure 4:
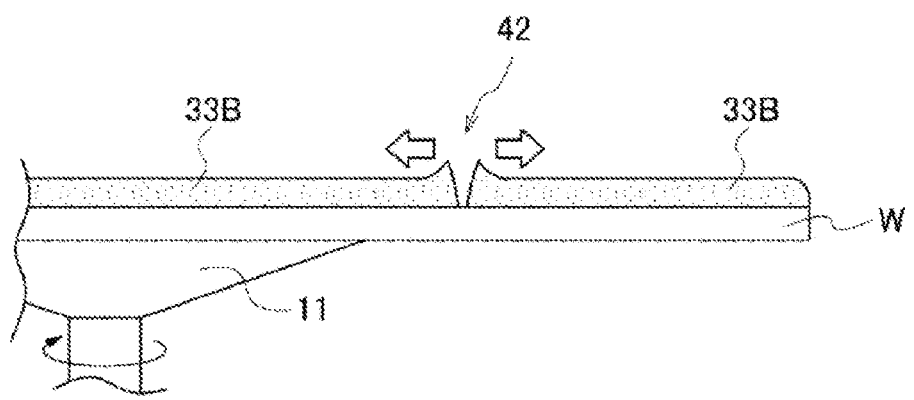
FIG. 4 is an explanatory view illustrating a wafer surface behavior of a liquid used in the developing apparatus.
Figure 5:
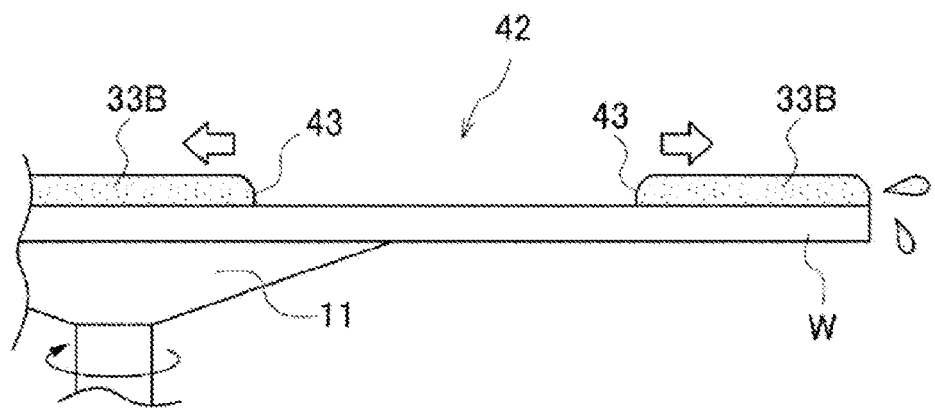
FIG. 5 is an explanatory view illustrating a wafer surface behavior of a liquid used in the developing apparatus.

A description of the behavior of the replacing liquid 33B on the surface of the wafer W when the centrifugal force generated by the rotation of the wafer W removes the replacing liquid 33B and while gas is not being supplied from the gas nozzle 34. Reference is appropriately made to FIGS. 3 to 5 which are schematic side views of the wafer W. Upon rotating the wafer W, a force exerted outward of the wafer W caused by the centrifugal force and a force exerted toward the center of a liquid film of the replacing liquid 33B, i.e., toward the center of the wafer W, caused by the cohesive force is applied to the replacing liquid 33B (see FIG. 3). In the figures, reference symbol 41 designates a ridge portion of a liquid film which is formed as the replacing liquid 33B gathers in the portion which the forces is balanced. The ridge portion 41 is formed between the central portion and the peripheral edge portion of the wafer W.

Figure 6:
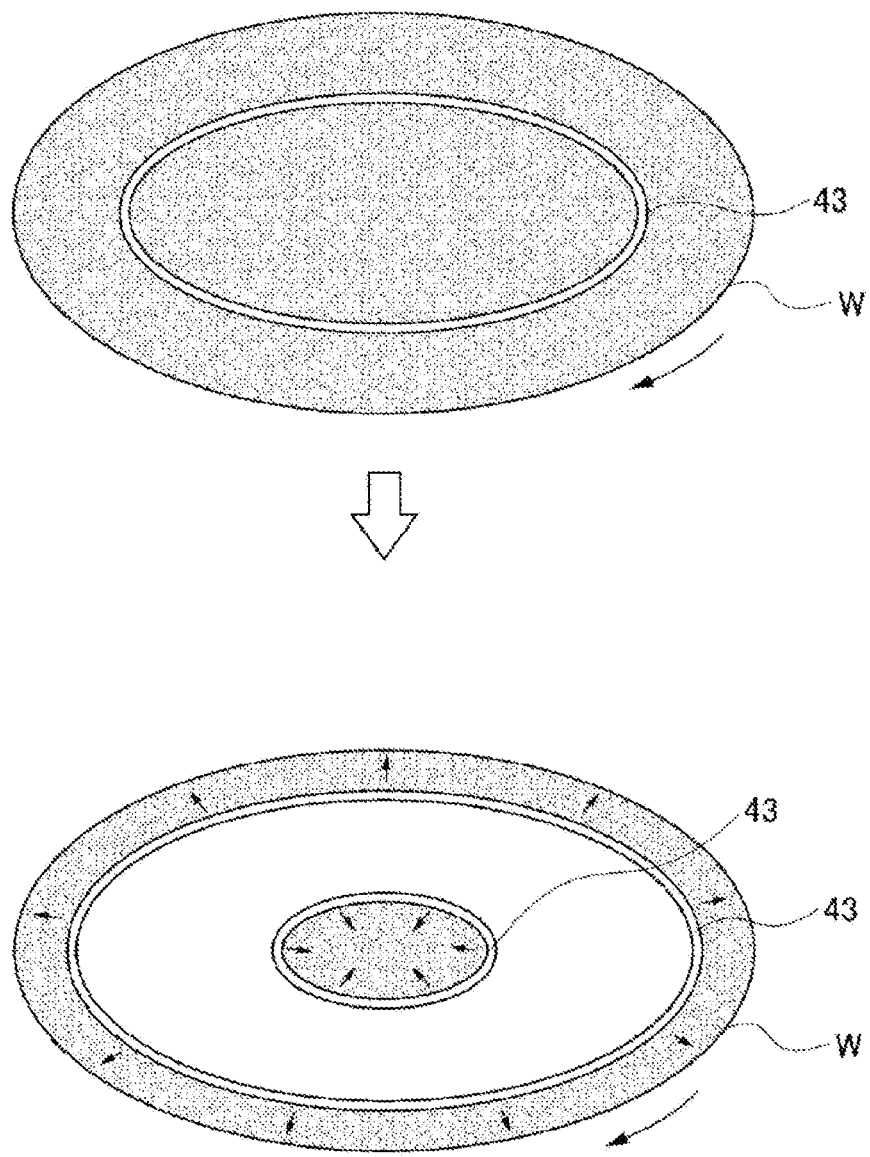
FIG. 6 is an explanatory view illustrating a state in which a wafer is dried by the behavior of the liquid.

As the wafer W rotates, a dry region 42 appears having a ring shape when seen in a plan view (see FIG. 4). In the dry region 42, the replacing liquid 33B is dried such that the liquid film is severed in or around the ridge portion 41, namely in the place where the centrifugal force acts stronger than the cohesive force. As shown in the upper area in FIG. 6, the interface between the dry region 42 and the liquid film is observed as an annular stripe 43 (referred to as a dry stripe).

As the wafer W further rotates, the liquid film existing inward of the dry region 42 recedes toward the center of the wafer W by the cohesive force. Further, the replacing liquid 33B of the liquid film existing outward of the dry region 42 starts to be removed from the wafer W by the centrifugal force while the liquid film outward of the dry region 42 recedes toward the outer periphery of the wafer W (see FIG. 5). That is, the dry region 42 is spread toward the center and the outer periphery of the wafer W. If the drying goes in this way, a dry stripe 43 moves toward the center of the wafer W while undergoing a decrease in diameter, and a dry stripe 43 moves toward the outer periphery of the wafer W while undergoing an increase in diameter, as shown in the lower area in FIG. 6.

Accordingly, as mentioned above, the replacing liquid 33B is easily recedes toward the center due to the cohesive force in the central region of the wafer W where the centrifugal force is weak. The dryness of the replacing liquid 33B varies in the central region of the wafer W during the drying process. Thus, the replacing liquid 33B remains on the wafer W. Furthermore, as mentioned above, if the ridge portion 41, namely the place where the replacing liquid 33B gathers, is formed, the centrifugal force cannot thoroughly remove the gathered replacing liquid 33B from the wafer W. That is, the replacing liquid 33B which forms on the ridge portion 41 is moved toward the peripheral edge portion of the wafer W. The peripheral edge portion of the wafer W is placed outside of the place where the ridge portion 41 is formed. The amount of the replacing liquid 33B grows larger in the peripheral edge portion. Thus, the dryness varies and a place where the replacing liquid 33B remains is not removed.

Figure 7:
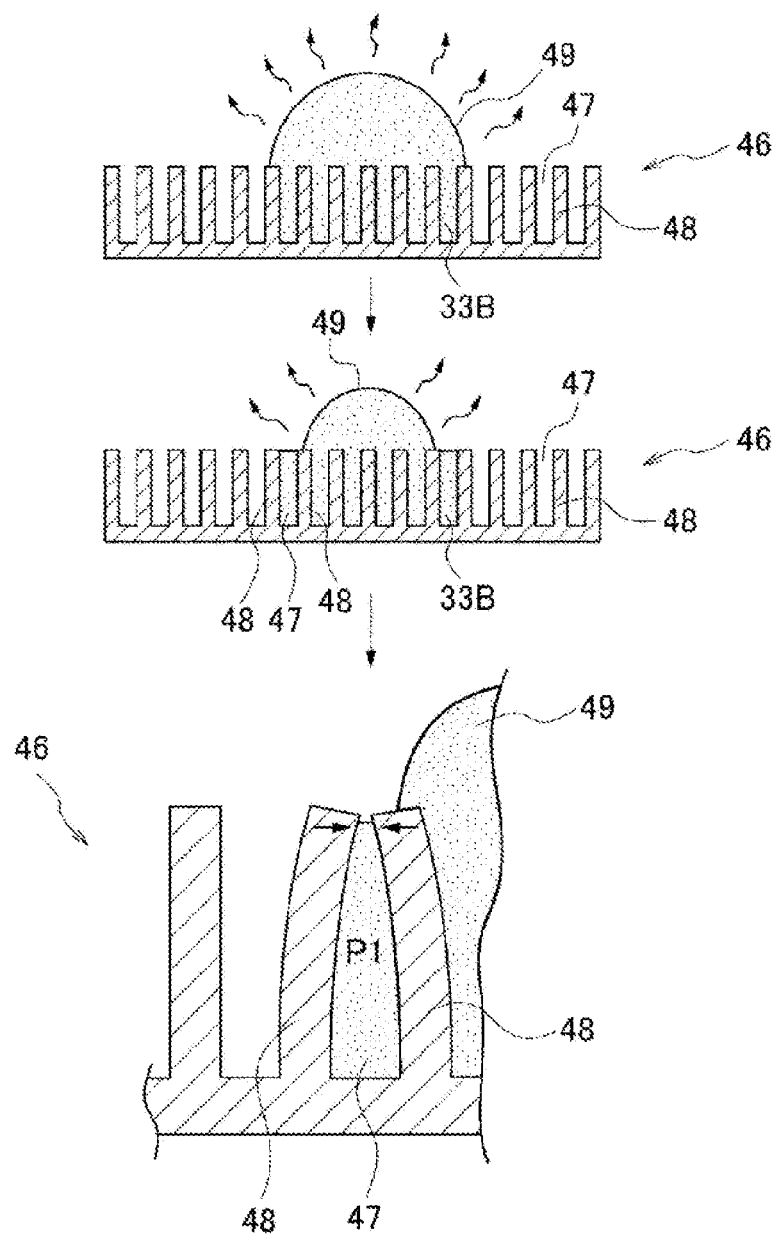
FIG. 7 is an explanatory view showing a change of a resist pattern when the liquid remains on a resist film.
Figure 9:
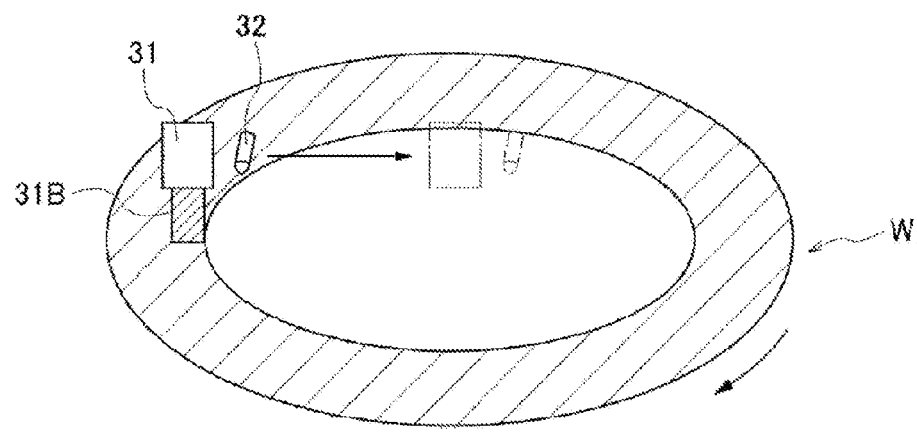
FIG. 9 is a schematic perspective view showing the wafer which is being processed by the developing apparatus.
Figure 10:
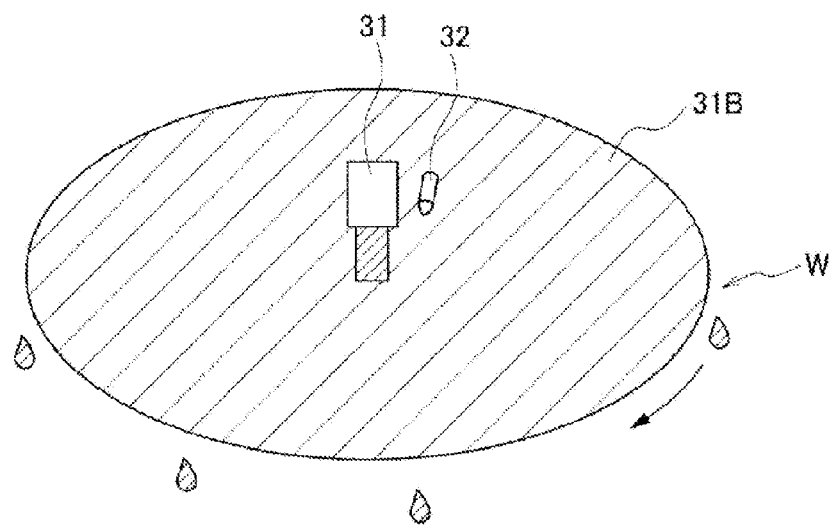
FIG. 10 is a schematic perspective view showing the wafer which is being processed by the developing apparatus.
Figure 11:
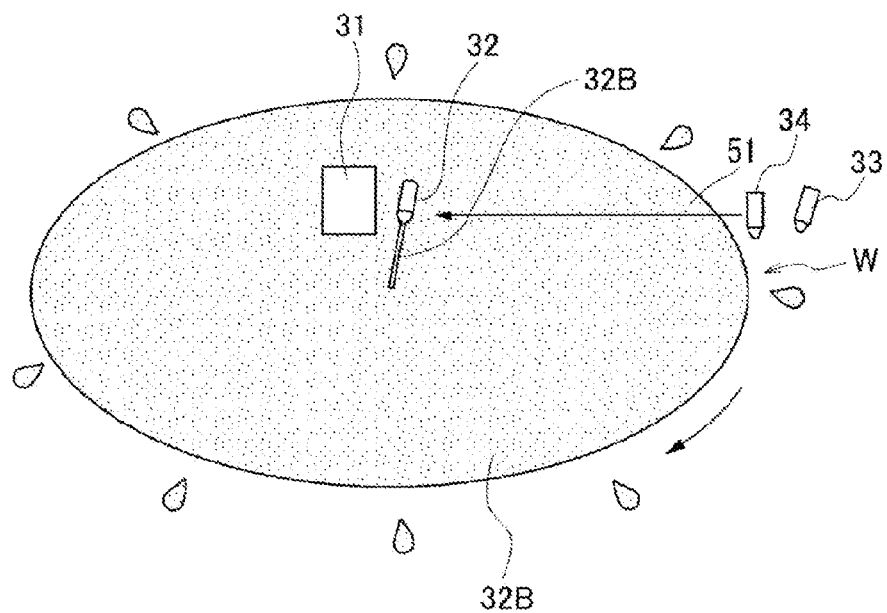
FIG. 11 is a schematic perspective view showing the wafer which is being processed by the developing apparatus.
Figure 12:
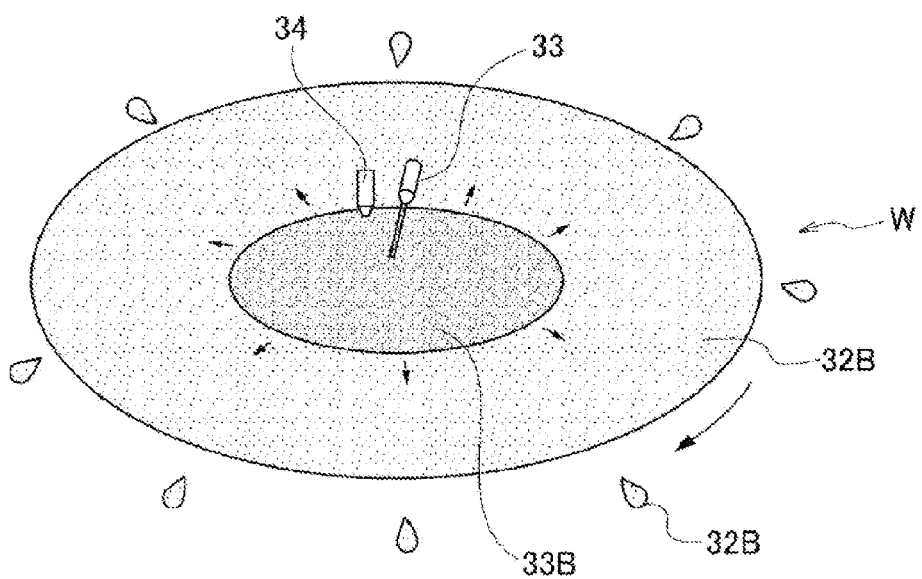
FIG. 12 is a schematic perspective view showing the wafer which is being processed by the developing apparatus.
Figure 13:
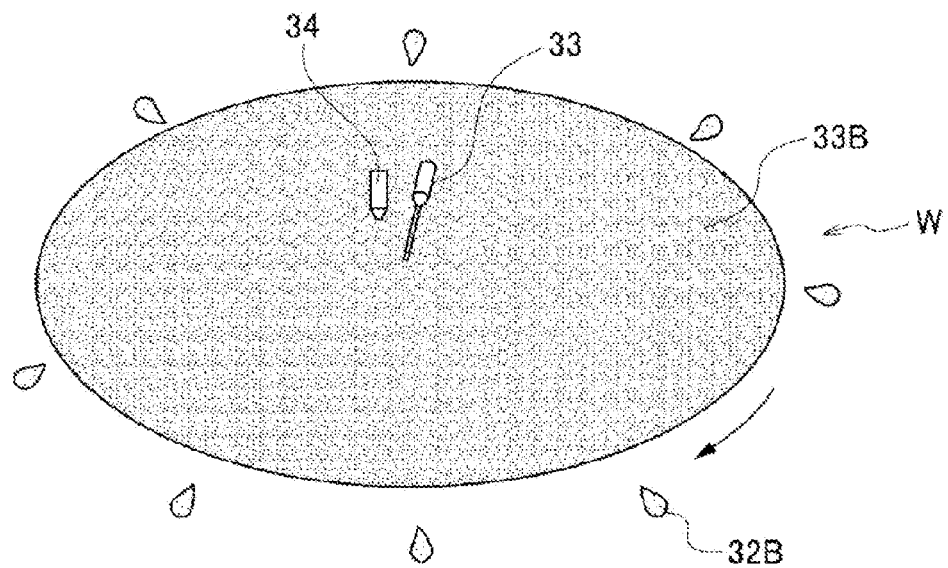
FIG. 13 is a schematic perspective view showing the wafer which is being processed by the developing apparatus.
Figure 14:
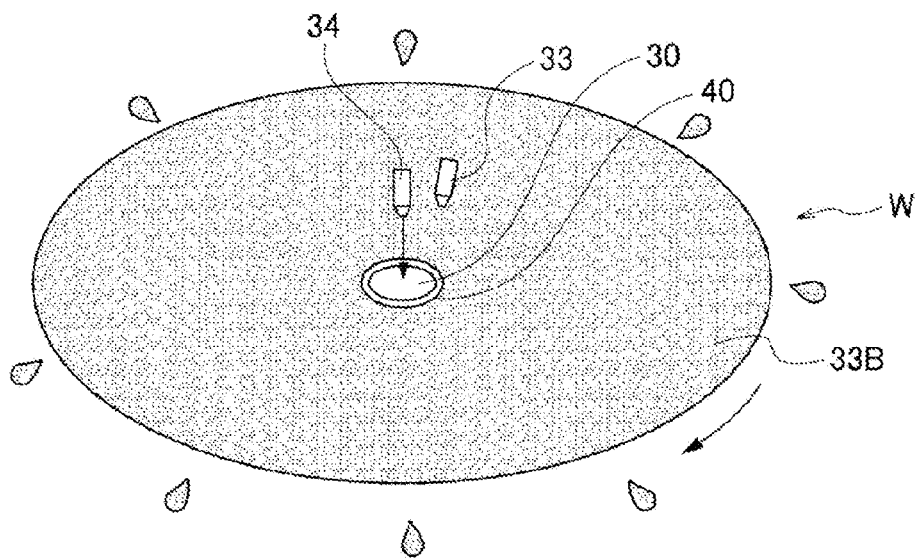
FIG. 14 is a schematic perspective view showing the wafer which is being processed by the developing apparatus.
Figure 15:
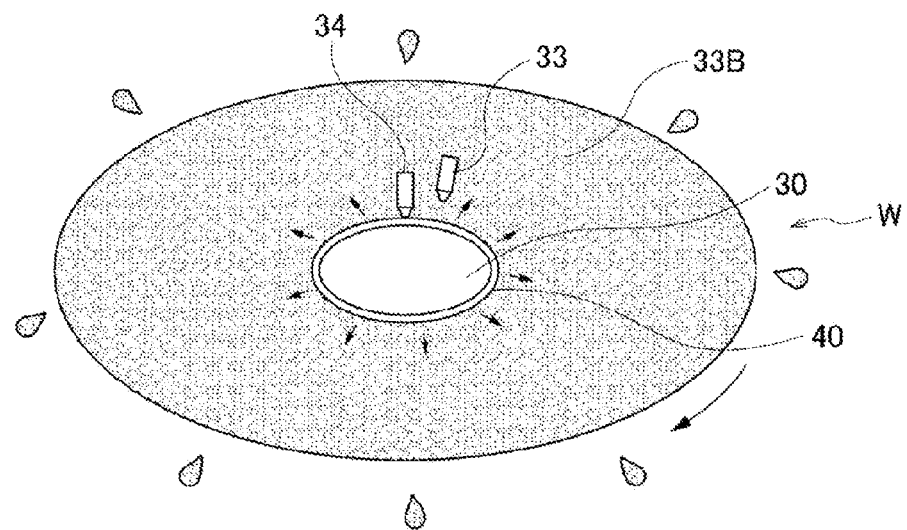
FIG. 15 is a schematic perspective view showing the wafer which is being processed by the developing apparatus.
Figure 16:
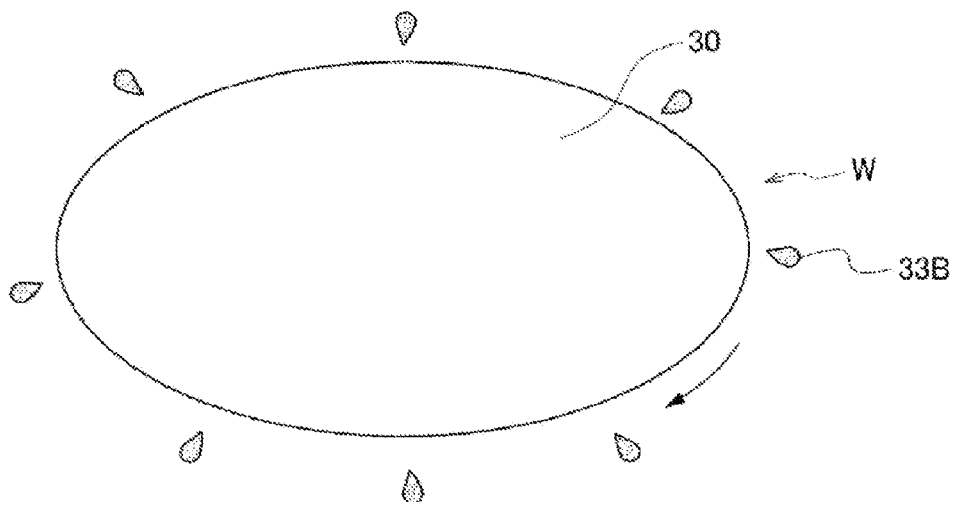
FIG. 16 is a schematic perspective view showing the wafer which is being processed by the developing apparatus.

In the upper portion of FIG. 7, there is shown a resist pattern 46 in which the replacing liquid 33B remains as mentioned above. In FIG. 7, reference symbol 47 designates recess portions of the resist pattern 46. Reference symbol 48 designates wall portions of the resist pattern 46. The wall portions 48 constitute the side walls of the recess portions 47. Reference symbol 49 designates a droplet of the replacing liquid 33B remaining on the resist pattern 46. If the volatilization of the droplet 49 goes ahead, the droplet 49 is reduced in size as shown in the middle in FIG. 7. The liquid surface of the replacing liquid 33B remaining in the recess portions 47 is contact with the ambient air. In FIG. 8, the forces exerted on the wall portions 48 forming the recess portions 47 are schematically indicated by arrows. As shown in the upper portion of FIG. 8, due to the surface tension γ of the liquid remaining in the recess portion 47, the transverse forces σ acting toward the inside of the recess portion 47 are exerted on the wall portions 48. The relationship between the transverse forces σ and the surface tension γ is given by the following equation 1. Since the surface tension γ of the replacing liquid 33B is relatively small, the transverse force σ is restrained from becoming larger. In equation 1, θ is the contact angle between the liquid (the replacing liquid 33B in the example), which remains within the recess portion 47 and the wall portions 48, H is the height of the wall portions 48, W is the width of the wall portions 48, and D is the width of the recess portion 47.

$$\sigma > 6\gamma \cos \theta / D(H/W) \qquad \text{equation 1}$$

However, as shown in the lower portion of FIG. 8, there are forces exerted on the wall portions 48 other than the transverse forces σ. Due to the cohesive force of the replacing liquid 33B remaining within the recess portion 47, stresses F (see equation 2) acting toward the inside of the recess portion 47 are exerted on the upper sections of the wall portions 48 which make contact with the liquid surface of the replacing liquid 33B. As illustrated in the lower portions of FIGS. 8 and 7, the upper sections of the wall portions 48 are attracted toward the inside of the recess portion 47. As a consequence, the wall portions 48 collapse. If the liquid remains within the recess portion 47 during the drying process mentioned above, stresses ΔP (see equation 3) originating from the surface tension λ, of the liquid are transversely exerted on the wall portions 48 toward the inside of the recess portion 47. In equation 3, Patm is the pressure which is based on the centrifugal force generated by the rotation of the wafer W during the drying process, and P1 is the pressure of the liquid remaining within the recess portion 47.

$$F = \gamma \sin \theta \qquad \text{equation 2}$$

$$\Delta P = P\text{atm} - P1 = 2\gamma \cos \theta / D \qquad \text{equation 3}$$

Accordingly, in the processing performed by the developing apparatus 1, for the purpose of preventing the pattern collapse, which is caused by the replacing liquid 33B remaining within the recess portion 47, a dry region is formed on the wafer W using the gas nozzle 34 as described later.

Next, a first processing method performed by the developing apparatus 1 will be described with reference to FIGS. 9 to 16, which show the states of the wafer W and the operations of the respective nozzles 31 to 34. For easy understanding of the figures, the arrangements of the respective nozzles in FIGS. 9 to 16 are illustrated to be different from those of in FIG. 2. The contact angle of the resist film formed on the wafer W with respect to the pure water is, e.g., 50 degrees or more, the wafer W processed in the developing apparatus 1.

The wafer W is transferred to the developing apparatus 1 by the substrate transfer mechanism, is mounted on the spin chuck 11, and then is rotated at a predetermined speed. The developing liquid nozzle 31 and the cleaning liquid nozzle 32 are moved from the standby region 38A to above the peripheral edge portion of the wafer W. A developing liquid 31B is discharged from the developing liquid nozzle 31 to the peripheral edge portion of the wafer W (see FIG. 9). The developing liquid nozzle 31 is moved in the transverse direction above the central portion of the wafer W. Thus, the discharge position of the developing liquid 31B is displaced along the radial direction of the wafer W, whereby the surface of the wafer W is covered with the developing liquid 31B. If the discharge position of the developing liquid 31B is located in the central portion of the wafer W, the movement of the developing liquid nozzle 31 is stopped.

The developing liquid 31B supplied to the central portion of the wafer W is spread toward the peripheral edge portion of the wafer W by the centrifugal force. As the resist film on the surface of the wafer W is developed, a resist pattern is formed in the resist film (see FIG. 10). Thereafter, the supply of the developing liquid 31B is stopped and the cleaning liquid nozzle 32 is moved to a predetermined position. When the revolution number of the wafer W becomes equal to, e.g., 500 rpm, a cleaning liquid (pure water) is discharged toward the central portion of the wafer W. The cleaning liquid is spread toward the peripheral edge portion of the wafer W by the centrifugal force. Thus, the developing liquid on the wafer W and the resist residue generated by the developing are washed away from the surface of the wafer W. The cleaning liquid 32B enters the recess portions of the resist pattern. A liquid film of the cleaning liquid 32B is formed on the surface of the wafer W (see FIG. 11).

Figure 17:
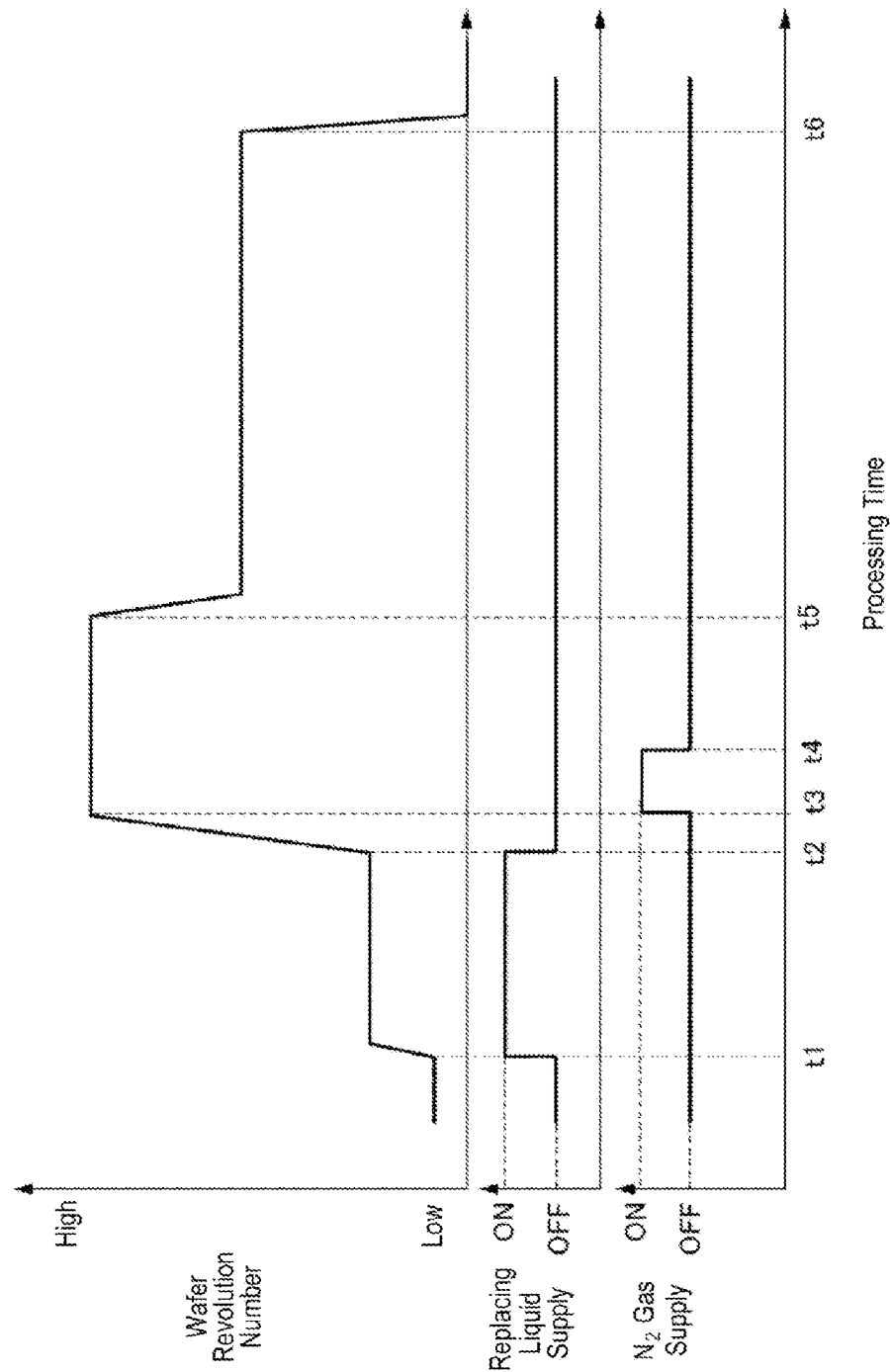
FIG. 17 is a timing chart of the processing.

Next, FIG. 17 is a timing chart showing the change in the revolution number of the wafer W and the replacing liquid and the $N_2$ gas according to the processing time. When a predetermined time elapses from the start of the discharge of the cleaning liquid, the discharge of the cleaning liquid 32B is stopped. The revolution number of the wafer W increases to, e.g., 750 rpm, simultaneously, and the replacing liquid 33B is supplied to the central portion of the wafer W from the replacing liquid nozzle 33. The replacing liquid nozzle 33 has moved from the standby region 38B to a specified position above the wafer W (at time t1 in the timing chart). The developing liquid nozzle 31 and the cleaning liquid nozzle 32 are returned to the standby region 38A. As mentioned above, the contact angle of the pure water as the cleaning liquid with respect to the resist film is relatively large. Therefore, with the lapse of time, the discharged cleaning liquid 32B on the resist film moves toward the center of the wafer W. The time from the beginning of the discharge of the cleaning liquid to the beginning of the discharge of the replacing liquid 33B is set to supply the replacing liquid 33B in a state of suppressing the cohesion of the cleaning liquid 32B. After the discharge of the cleaning liquid 32B is stopped, the replacing liquid 33B is discharged rapidly.

The replacing liquid 33B is spread from the central portion toward the peripheral edge portion of the wafer W by the centrifugal force, thereby causing the cleaning liquid 32B to flow toward the peripheral edge portion of the wafer W. Thus, the liquid within the recess portions of the resist pattern is replaced from the cleaning liquid 32B to the replacing liquid 33B. The liquid film on the surface of the wafer W is changed from the cleaning liquid 32B to the replacing liquid 33B (see FIG. 12). In order to allow the replacing liquid 33B to reliably spread toward the peripheral edge portion of the wafer W against the cohesive force of the cleaning liquid, it is preferred in some embodiments that the revolution number of the wafer W during the discharge of the replacing liquid 33B is set higher than that during the discharge of the cleaning liquid. After a predetermined time, e.g., five seconds, elapses from time t1, the revolution number of the wafer W starts to increase and the replacing liquid 33B stops to be discharged (at time t2). Thus, the spreading of the replacing liquid 33B toward the peripheral edge portion of the wafer W is completed (see FIG. 13).

The gas nozzle 34 is moved to a predetermined position. As the revolution number of the wafer W continues to increase, the centrifugal force applied to the replacing liquid 33B on the surface of the wafer W becomes larger. Thus, the centrifugal removal of the replacing liquid 33B goes ahead, and the thickness of the liquid film of the replacing liquid 33B in the central portion of the wafer W becomes smaller. When the revolution number of the wafer W becomes equal to, e.g., 2000 rpm, an $N_2$ gas starts to be discharged toward the central portion of the wafer W (at time t3). The revolution number of the wafer W is kept to be, e.g., 2000 rpm.

Figure 18:
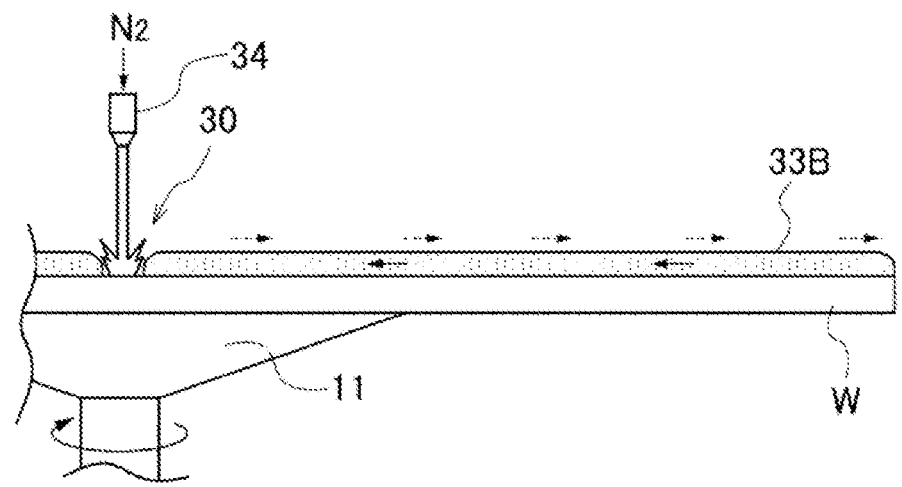
FIG. 18 is a side view showing the wafer which is being processed.

FIG. 18 shows the side surface of the wafer W at this time. The solid line arrows indicate the cohesive force of the liquid film described earlier. The dot line arrows indicate the centrifugal force. As mentioned above, the thickness of the liquid film of the replacing liquid 33B become smaller in the central portion of the wafer W. The discharged $N_2$ gas breaks the liquid film of the replacing liquid 33B. Thus, a circular dry region 30 in which the surface of the resist film becomes exposed is formed in the central portion of the wafer W (see FIG. 14). As such, the dry region 30 is formed in this way, and the liquid film of the replacing liquid 33B in the central portion of the wafer W is removed. Consequently, the cohesive force acting toward the center of the wafer W in the liquid film of the replacing liquid 33B on the wafer W becomes weaker. When time, e.g., one second elapses from the time t3, the supply of the $N_2$ gas is stopped (at time t4). The nozzles 33 and 34 are returned to the standby region 38B. Thereafter, the wafer W continues to rotate at 2000 rpm for a while. When the dry region 30 reaches the peripheral edge portion of the wafer W, the revolution number of the wafer W starts to be reduced (at time t5) and then is kept to be 1500 rpm.

Figure 19:
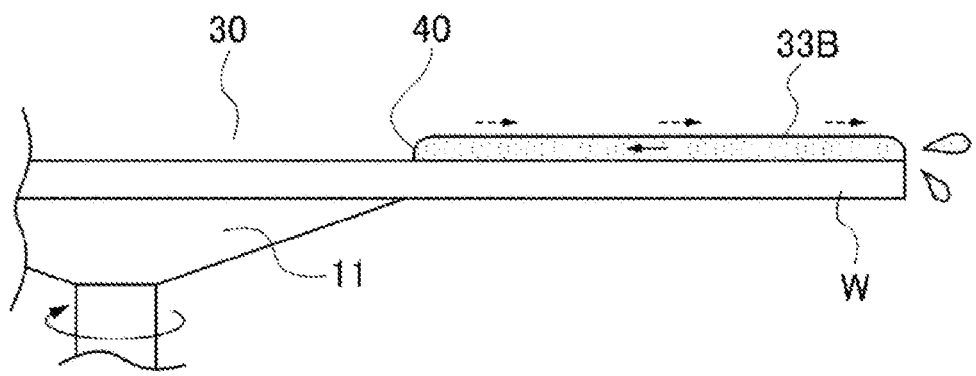
FIG. 19 is a side view showing the wafer which is being processed.

Because the cohesive force is weak, the replacing liquid 33B on the surface of the wafer W is easily removed from the peripheral edge portion of the wafer W by the centrifugal force. Further, the replacing liquid 33B is removed from the wall portions and the recess portions of the resist pattern. The dry region 30 is expanded toward the peripheral edge portion of the wafer W by the centrifugal force. The replacing liquid 33B is pressed from the central portion toward the peripheral edge portion of the wafer W and is removed from the wafer W as shown in FIG. 19. Thus, the uniformity of dryness in the circumferential direction of the wafer W becomes higher and the drying goes ahead from the central portion toward the peripheral edge portion of the wafer W. The interface between the dry region 30 and the liquid film of the replacing liquid 33B is observed as an annular dry stripe 40. Since the drying proceeds as mentioned above, the dry stripe 40 is gradually enlarged (see FIG. 15).

It will be explained why the revolution number of the wafer W is reduced after the formation of the dry region 30. Since the velocity of the rotating wafer W is higher in the peripheral edge portion than in the central portion, the peripheral edge portion of the wafer W is dried more rapidly than the central portion thereof. According to evaluation tests described below, if the peripheral edge portion of the wafer W is dried before the dry region 30 is expanded to the peripheral edge portion of the wafer W, defects are generated in the resist pattern. In order to prevent the defects, the peripheral edge portion of the wafer W is slowly dried by reducing the revolution number of the wafer W. If the dry region 30 reaches the peripheral edge portion of the wafer W (see FIG. 16), that is, time, e.g., fifteen seconds, elapses from the time t5, the rotation of the wafer W is slowed down (at time t6) and is stopped. The wafer W is delivered to the substrate transfer mechanism not shown and is carried out of the developing apparatus 1.

In the processing performed by the developing apparatus 1, the cleaning liquid 32B as pure water is supplied to the wafer W and then the aforementioned replacing liquid 33B is supplied to the wafer W, thereby reducing the stresses applied to the wall portions of the resist pattern and preventing the percolation of the replacing liquid 33B into the wall portions. As described above, the dry region formed in the central portion of the wafer W is expanded toward the peripheral edge portion of the wafer W. The replacing liquid 33B is centrifugally removed from the wafer W. Thus, the replacing liquid 33B is restrained from remaining in the central portion and the peripheral edge portion of the wafer W. The wafer W is dried with high in-pane drying uniformity, thereby suppressing the collapse of the resist pattern which may be caused by the remaining replacing liquid 33B. As a result, it is possible to form a resist pattern having a minute line width. It is also possible to suppress a decrease in the throughput of semiconductor products.

The revolution number of the wafer W is set to be equal to, e.g., 100 rpm to 750 rpm during the discharge of the replacing liquid 33B which spans from the time t1 to the time t2, in order to reliably replace the liquid existing on the surface of the wafer W. The time period from the time t2 to the time t3 means that from the stop of discharge of the replacing liquid to the start of supply of the $N_2$ gas. The time period between the times t2 to t3 is in some cases set equal to 0 second to 4 seconds in order to suppress the percolation of the replacing liquid 33B into the wafer W. As described later with respect to evaluation tests, the revolution number of the wafer W during the discharge of the $N_2$ gas which spans from the time t3 to the time t4 is in some cases set to be equal to the revolution number, e.g., 1500 rpm to 2500 rpm. At this revolution number, the dry region 30 can be formed by the centrifugal force as mentioned above and the drying of the peripheral edge portion of the wafer W can be suppressed. As described later with respect to the evaluation tests, the discharge time period of the $N_2$ gas is in some cases set to be equal to 1 second to 2 seconds in order to prevent the variant dryness between resist patterns. The discharge flow rate of the $N_2$ gas discharged from the gas nozzle 34 is, e.g., from 3 L/min to 8 L/min. During the process spanning from the time t5 to the time t6, the discharge of the $N_2$ gas is stopped and the dry region 30 is expanded toward the peripheral edge portion of the wafer W. The process from the time t5 to the time t6 is in some cases performed at the revolution number of the wafer W of 1500 rpm or more in order to have the dry region 30 reach the peripheral edge portion of the wafer W to the end of the process. For the same reason, the time period from the time t5 to the time t6 is in some cases set to be equal to 15 seconds or more.

Figure 20:
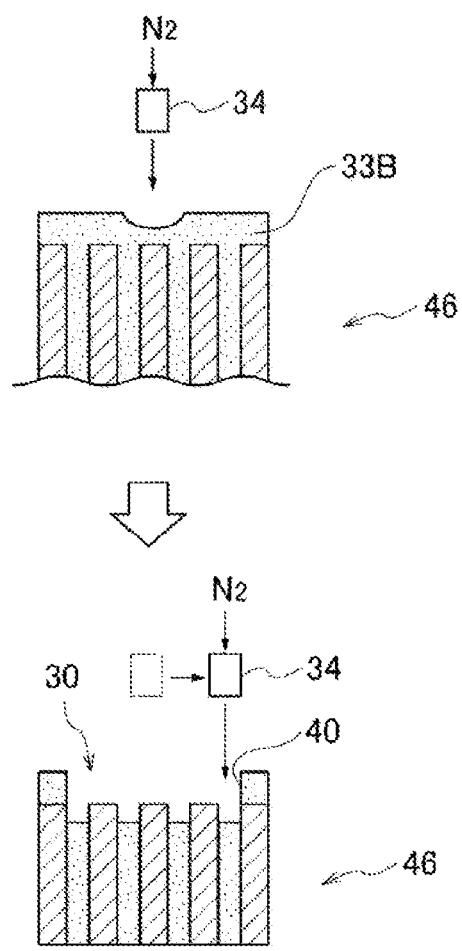
FIG. 20 is a schematic view of the resist pattern.

In the first processing method mentioned above, the discharge position of the $N_2$ gas is fixed to the central portion of the wafer W. Alternatively, in a second processing method, after the dry region 30 is formed by discharging the $N_2$ gas to the central portion, the gas nozzle 34 may be moved to displace the discharge position. More specifically, as shown in FIG. 20, the discharge position of the $N_2$ gas may be moved to an off-centered position away from the central portion of the wafer W so as not to overtake the dry stripe 40. That is to say, the off-centered position is the position that does not get out of the dry region 30.

The discharge position of the $N_2$ gas is set so as not to overtake the dry stripe 40, because, if the wafer W is dried before the dry region 30 reaches the peripheral edge portion of the wafer W, defects may be generated in the resist pattern. By moving the discharge position of the $N_2$ gas in this manner, it is possible to increase the amount of the $N_2$ gas supplied to the surface of the wafer W and to reliably expose the surface of the wafer W to the dry region 30. As a result, the replacing liquid 33B can be removed. It is considered that this processing becomes more effective as the substrate to be processed grows larger in size. When the water repellency of the resist film is high, it is effective to move the discharge position of the $N_2$ gas in the aforementioned manner. The reason is that as the water repellency becomes higher, the liquid on the surface of the resist film is more easily moved across the surface of the resist film by the transverse force, e.g., the surface energy of the resist film. That is, the movement of the nozzle makes it easy to apply the transverse force to the replacing liquid 33B, thus the surface of the resist film is dried rapidly. The discharge position of the $N_2$ gas may be moved to an off-centered position while performing the discharge of the $N_2$ gas. Also, the discharge of the gas may be first stopped after the formation of the dry region 30 and then the gas may be discharged to the off-centered position.

The supply of the cleaning liquid 32B and the replacing liquid 33B is performed by a so-called spin coating method using the centrifugal force of the wafer W. However, the present disclosure is not limited to such a supply method. As an alternative example, a nozzle elongated in the horizontal direction may be prepared and may be horizontally moved from one end portion to the other end portion across the wafer W. For example, a discharge hole having a length substantially equal to the diameter of the wafer W may be formed in the nozzle. During the movement of the nozzle, the respective liquids may be discharged from the discharge hole. In this way, the respective liquids may be supplied to the wafer W.

Evaluation Tests (Evaluation Test 1)

Next, description will be given on the evaluation tests conducted with respect to the present disclosure. In evaluation test 1, the supply of the developing liquid 31B, the supply of the cleaning liquid 32B, the supply of the replacing liquid 33B and the drying of the wafer W by the centrifugal removal of the liquid, all of which have been described with respect to this embodiment, were performed one after another. After the drying, the measurement of the CD of the resist pattern thus formed and the measurement of the degree of occurrence of the pattern collapse were carried out. In evaluation test 1, when drying the wafer W, the formation of the dry region 30 by the gas supply was not performed. Evaluation test 1 was performed using the wafers W on which two kinds of resist films (referred to as resist films A and B) differing in components from each other are formed. A control test was conducted under the same conditions as those of evaluation test 1 except that the supply of the replacing liquid is not performed.

Comparing the result of evaluation test 1 and the result of the control test with respect to the wafer W on which the resist film A is formed, the CD is 1.3 nm larger in evaluation test 1 than in the control test. Comparing the result of evaluation test 1 and the result of the control test with respect to the wafer W on which the resist film B is formed, the CD is 1.3 nm larger in evaluation test 1 than in the control test. When a test was conducted in the same manner as in evaluation test 1 using, instead of the replacing liquid 33B, a low-surface-tension cleaning liquid not added with a percolation inhibitor described in the background section of this disclosure, it was reported that the CD is 2.8 nm larger in the test using the low-surface-tension cleaning liquid than in the control test. This means that the use of the replacing liquid 33B is effective in suppressing the change in the CD of the pattern. In either of the cases where the resist film A is used and the case where the resist film B is used, the degree of occurrence of the pattern collapse is lower in evaluation test 1 than in the control test. Even from this viewpoint, it was revealed that the use of the replacing liquid 33B is effective.

(Evaluation Test 2)

In evaluation test 2, the supply of the developing liquid 31B, the supply of the cleaning liquid 32B, the supply of the replacing liquid 33B and the drying by the centrifugal removing of the liquid, all of which have been described with respect to the first processing method of the embodiment, were performed one after another with respect to the wafer W. In evaluation test 2, just like evaluation test 1, the formation of the dry region 30 by the gas supply was not performed. During the supply of the replacing liquid 33B, the revolution number of the wafer W was set to be equal to 250 rpm. Thereafter, the revolution number of the wafer W was differently set within the range of 500 to 2000 rpm with respect to different wafers W. The surface states of the wafers W obtained when the wafers W are rotated at the preset revolution numbers were observed. The times required in finishing the drying after rotating the wafers W at the preset revolution numbers were measured. In evaluation test 2, the test conducted at the preset revolution number of 500 rpm will be referred to as evaluation test 2-1. The test conducted at the preset revolution number of 1000 rpm will be referred to as evaluation test 2-2. The test conducted at the preset revolution number of 1500 rpm will be referred to as evaluation test 2-3. The test conducted at the preset revolution number of 2000 rpm will be referred to as evaluation test 2-4.

Figure 21:
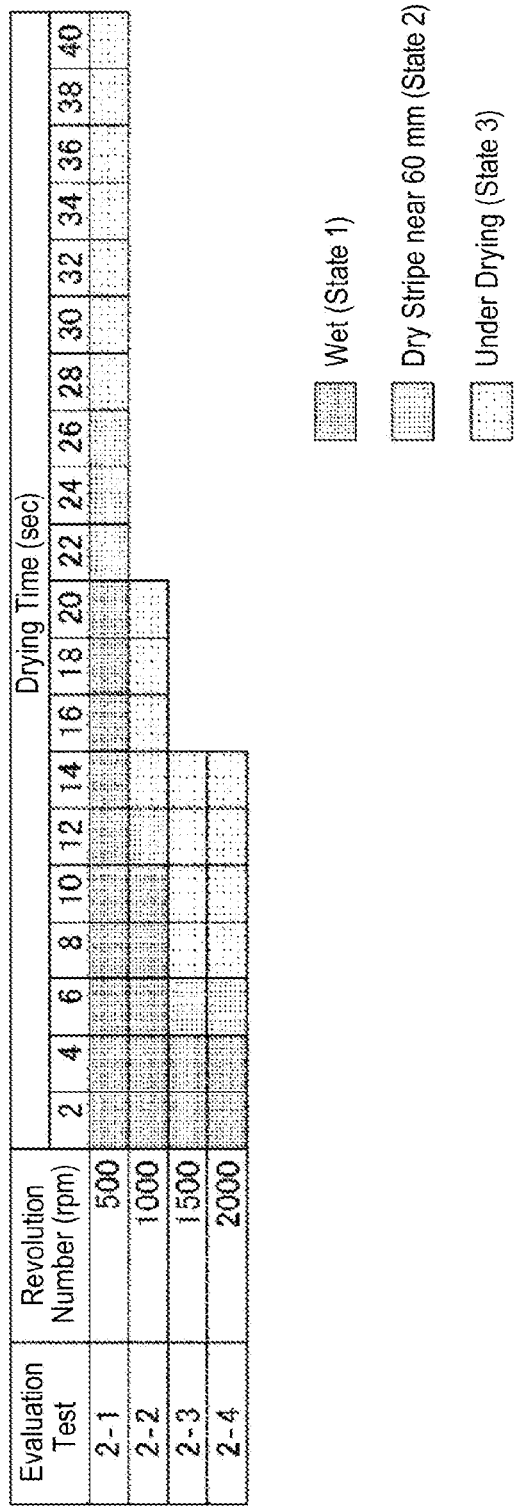
FIG. 21 is a table showing the results of evaluation tests.

FIG. 21 is a chart showing the result of evaluation test 2. FIG. 21 shows the surface states of the wafers W which are divided into three kinds of surface states at an interval of 2 seconds after the preset revolution numbers. The surface states thus divided include state 1 in which the entirety of the wafer W remains wet, state 2 in which the annular dry stripe 43 described in connection with FIG. 6 emerges in the place spaced apart 60 mm from the center of the wafer W, and state 3 in which the dry stripe 43 is separated (bisected) as mentioned above and is moved toward the central portion and the peripheral edge portion of the wafer W to dry the wafer W.

As shown in FIG. 21, in evaluation tests 2-1, 2-2, 2-3 and 2-4, the wafers W rotated at the preset revolution numbers were dried after the lapse of 40 seconds, 20 seconds, 14 seconds and 14 seconds, respectively. That is to say, in evaluation tests 2-1 and 2-2, the drying of the replacing liquid is accelerated as the preset revolution numbers grows larger. In evaluation tests 2-3 and 2-4, the drying is identically performed. As shown in FIG. 21, in evaluation test 2-1, states 2 emerge when 22, 24, and 26 seconds elapse after rotating the wafer W at the preset revolution number. In evaluation test 2-2, state 2 emerges when 12 seconds elapse after rotating the wafer W at the preset revolution number. In evaluation tests 2-3 and 2-4, state 2 emerges when 6 seconds elapse after rotating the wafers W at the preset revolution numbers. In evaluation tests 2-1 to 2-4, it was observed that state 3 is obtained after state 2.

A control test was conducted under the same conditions as in evaluation tests 2-1 to 2-4 except that the low-surface-tension cleaning liquid is used in place of the replacing liquid 33B. In the control test, it was observed that the drying proceeds from the central portion toward the peripheral edge portion of the wafer W without going through states 2 and 3. The result of evaluation test 2 reveals that the replacing liquid 33B is high in the cohesive force and low in the malleability on the wafer W. For that reason, as described with respect to the embodiment, it is expected that the non-uniformity of dryness within the plane of the wafer W becomes higher, namely the liquid remains within the plane of the wafer W, and further that the suppression of the pattern collapse and the developing defects is reduced by the residual liquid.

(Evaluation Test 3)

Figure 22:
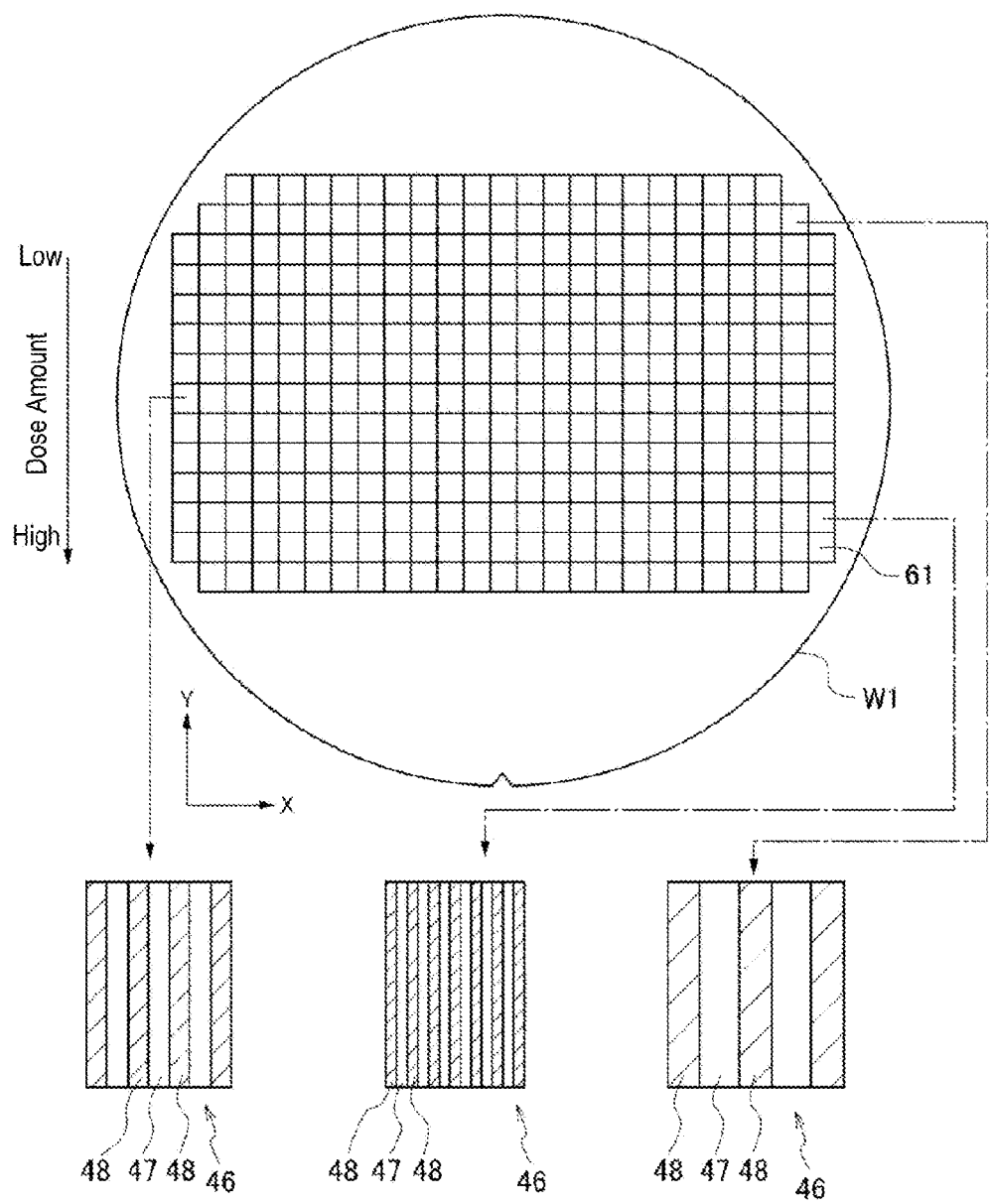
FIG. 22 is a plan view of a test wafer used in the evaluation tests.

FIG. 22 is a schematic view of a test wafer W1 on which a resist film is formed. A plurality of rectangular exposure regions 61 was defined so as to have a vertical and horizontal matrix shape when seen in a plan view with a cutout (notch) indicative of the azimuth of the wafer W1 facing downward. The exposure regions 61 disposed along the horizontal direction when see in a plan view are set to be exposed at the same dose amount (exposure amount). The lower the positions of the exposure regions 61, the larger the dose amount becomes. In FIG. 22, with respect to the three different exposure regions 61 disposed in the vertical direction, the upper surfaces of the resist patterns 46 formed in the respective exposure regions 61 are schematically illustrated at the ends of the chain line arrows. As shown in FIG. 22, the CD of the resist pattern 46 becomes smaller as the dose amount grows larger. That is to say, the line width becomes smaller and the pattern collapse tends to occur with ease. A plurality of linear resist patterns 46 is formed in one exposure region 61. It is sometimes the case that the wafer W1 is described with the horizontal direction thereof referred to as an X-direction and the vertical direction thereof referred to as a Y-direction.

Evaluation test 3-1 was conducted in the same manner as in evaluation test 2 except that the wafer W1 is used and the supply of the replacing liquid 33B is not supplied. That is to say, the supply of the developing liquid 31B, the supply of the cleaning liquid 32B and the drying by the centrifugal removing of the cleaning liquid 32B were performed one after another with respect to the wafer W1. In evaluation test 3-2, the supply of the developing liquid 31B, the supply of the cleaning liquid 32B, the supply of the replacing liquid 33B and the drying by the centrifugal removing of the replacing liquid 33B were performed one after another with respect to the wafer W1. In evaluation tests 3-1 and 3-2, when centrifugally removing the liquid, the dry region 30 is not formed. In evaluation test 3-2, the revolution number of the wafer W1 during and after the supply of the replacing liquid 33B differs from the revolution number used in the first processing method. More specifically, the replacing liquid 33B is supplied at the revolution number of 250 rpm. The supply of the replacing liquid 33B is stopped and then the replacement is performed at the revolution number of 500 rpm. Thereafter, the replacing liquid 33B is centrifugally removed from the wafer W1 at the revolution number of 2000 rpm. In evaluation tests 3-1 and 3-2, after finishing the processing of the wafer W1, the percentages of occurrence of pattern collapse in the respective exposure regions 61 were calculated.

Figure 23:
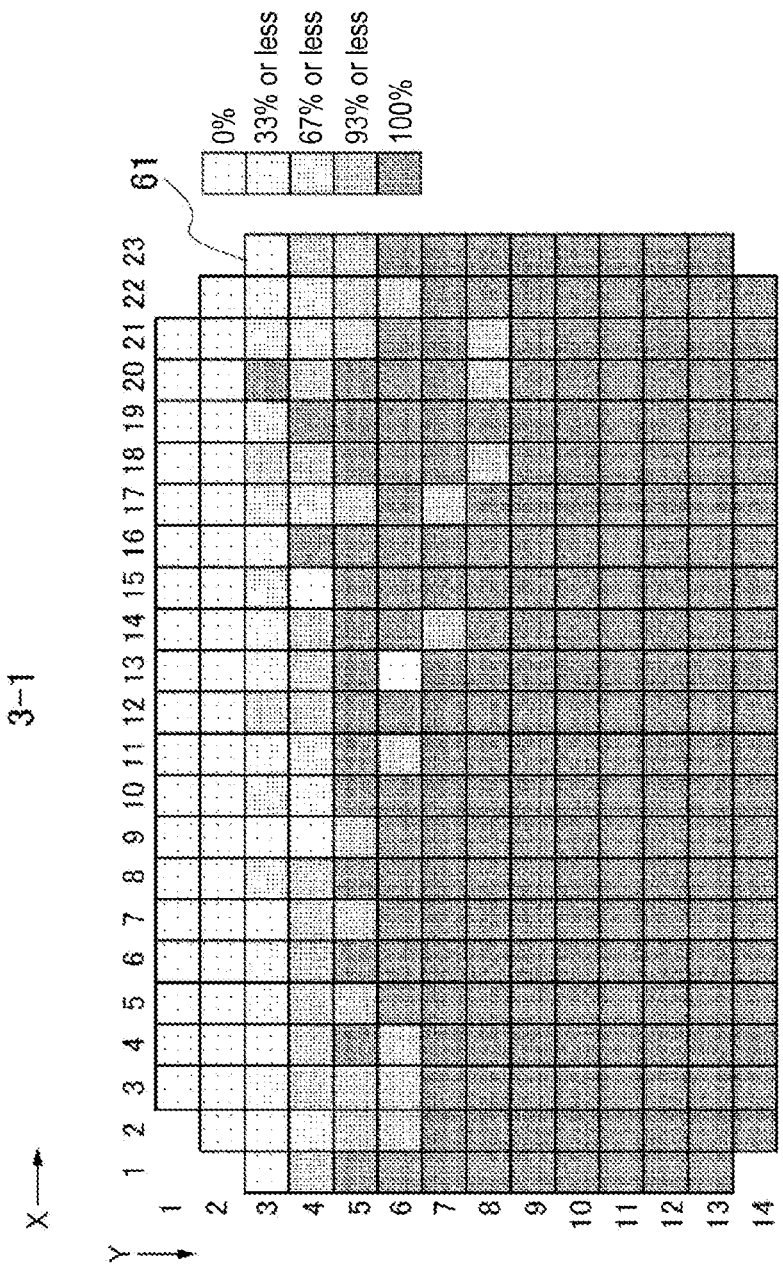
FIG. 23 is a distribution map of pattern collapse percentages obtained in the evaluation tests.
Figure 24:
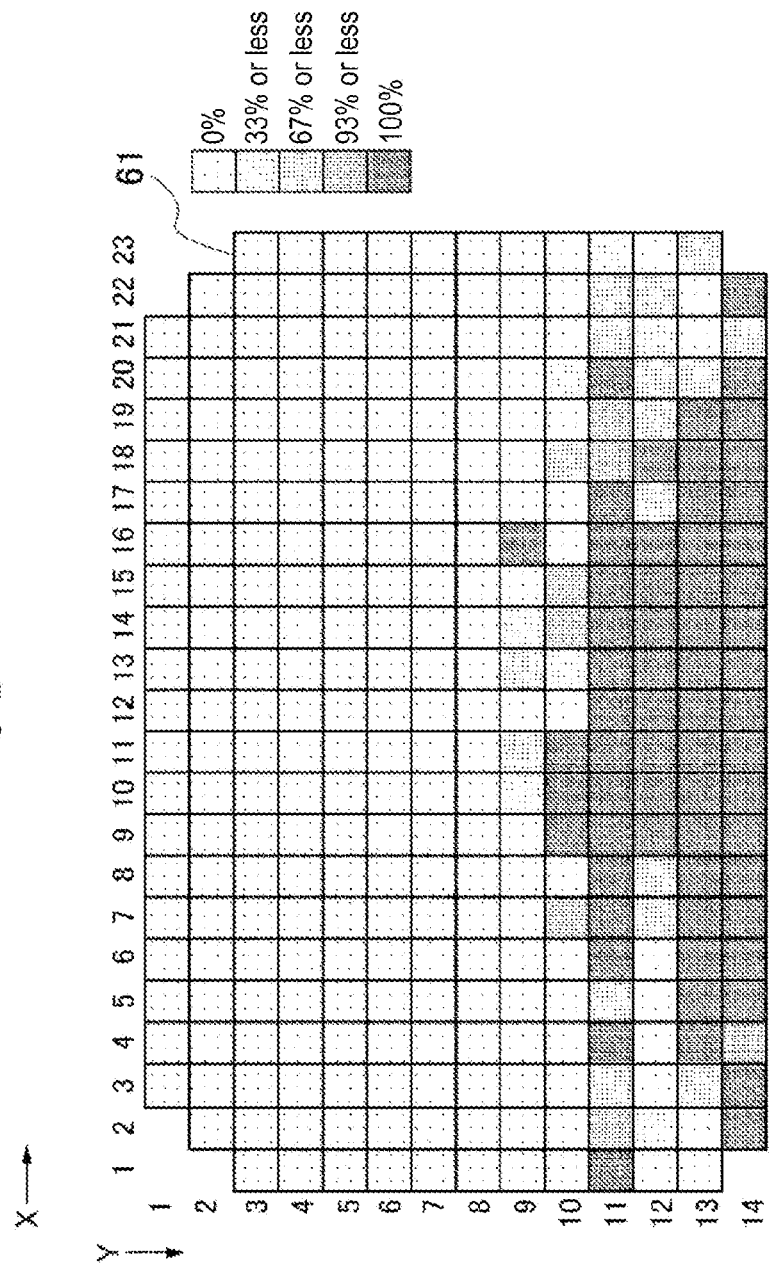
FIG. 24 is a distribution map of pattern collapse percentages obtained in the evaluation tests.

FIG. 23 shows the result of evaluation test 3-1 and FIG. 24 illustrates the result of evaluation test 3-2. In FIGS. 23 and 24, the respective exposure regions 61 are indicated by five stages of different gray scales depending on the percentages of occurrence of pattern collapse. The percentages of occurrence of pattern collapse are divided into a percentage of 0%, a percentage of more than 0% and not more than 33%, a percentage of more than 33% and not more than 67%, a percentage of more than 67% and not more than 93%, and a percentage of 100%. The larger pattern collapse percentage is indicated by a darker gray scale. The up-down direction and the left-right direction in FIGS. 23 and 24 correspond respectively to the up-down direction and the left-right direction of the wafer W1 shown in FIG. 24. That is to say, the exposure regions 61 positioned leftward in FIGS. 23 and 24 are positioned at the left side of the wafer W1 having the downwardly-facing notch shown in FIG. 22. The exposure regions 61 positioned downward in FIGS. 23 and 24 are positioned at the lower side of the wafer W1. For the sake of making the figures easily understandable, serial numbers are assigned along the up-down direction and the left-right direction.

As is apparent in FIGS. 23 and 24, the number of the exposure regions 61 suffering from pattern collapse is smaller in evaluation test 3-2 than in evaluation test 3-3. In evaluation test 3-2, the pattern collapse is suppressed even if the dose amount is kept relatively high. In evaluation tests 3-1 and 3-2, the percentage (%) of occurrence of pattern collapse is calculated by an equation: (the number of the exposure regions 61 suffering from the pattern collapse in the identical position in the Y-direction/the number of all the exposure regions 61 existing in the identical position in the Y-direction)×100. The dose amount of the exposure regions 61 that becomes largest insofar as the calculated occurrence percentage does not exceed 20% is assumed to be a critical dose amount. The CD value of the resist pattern obtained by the critical dose amount is calculated as a critical CD. The critical CD in evaluation test 3-1 was 40.5 nm and the critical CD in evaluation test 3-2 was 36.9 nm. That is to say, in evaluation test 3-2, as compared with evaluation test 3-1, the critical CD is increased by (40.5−36.9)/40.5×100=8.9%.

The result of evaluation test 3 reveals that the pattern collapse can be suppressed by replacing the cleaning liquid 32B with the replacing liquid 33B. In evaluation test 3-2, as can be seen in the exposure regions 61 having Y-direction serial number 9 in FIG. 24, the pattern collapse does not occur in the exposure regions 61 existing near the peripheral edge portion of the wafer W1. However, the pattern collapse occurs in the exposure regions 61 having X-direction serial numbers 10, 11, 13, 14, and 16 positioned in the central portion of the wafer W1. It appears that the pattern collapse has occurred because the replacing liquid 33B remains in the central portion of the wafer W1 during the drying process of the wafer W1.

(Evaluation Test 4)

In evaluation test 4-1, instead of investigating the pattern collapse percentages, the number of developing defects and the kind of developing defects were investigated with respect to the wafer W1 processed in evaluation test 3-1. In evaluation test 4-2, just like evaluation test 4-1, the number of developing defects and the kind of developing defects were investigated with respect to the wafer W1 processed in evaluation test 3-2.

In evaluation test 4-2, the number of developing defects was reduced to 1/40 of the number of developing defects generated in evaluation test 4-2. As for the kind of developing defects, the ratio of the number of defects attributable to the liquid remaining on the wafer W1, which is observed as a black spot, to the number of all defects observed was 5.93% in evaluation test 4-1 and 63.0% in evaluation test 4-2. In evaluation test 4-2, the number of developing defects was suppressed and the places where the developing defects are observed relatively leaned toward the central portion and the peripheral edge portion of the wafer W1.

Evaluation test 4 reveals that the generation of developing defects can be suppressed by performing the replacement of the cleaning liquid 32B with the replacing liquid 33B but the defects are still generated due to replacing liquid 33B remaining in the central portion and the peripheral edge portion of the wafer W1. It is considered that, by reducing the residual liquid, it is possible to reduce the number of developing defects and, eventually, to suppress the pattern collapse observed in evaluation test 3. The results of evaluation tests 1 to 4 obtained as above has motivated the present inventors to conceive the formation of the dry region 30 using the gas nozzle 34 as described in the foregoing embodiment.

(Evaluation Test 5)

In evaluation test 5-1, just like evaluation test 3-2, the supply of the developing liquid 31B, the supply of the cleaning liquid 32B, the supply of the replacing liquid 33B and the drying by the centrifugal removing of the liquid were performed one after another with respect to the wafer W1. In evaluation test 5-1, the formation of the dry region 30 was not performed. The revolution number of the wafer W1 was controlled in the same manner as described in evaluation test 3-2. In evaluation test 5-2, the processing was performed substantially in the same manner as in the first processing method of the aforementioned embodiment except for a small difference in the control of the revolution number of the wafer W1. That is to say, in evaluation test 5-2, the formation of the dry region 30 was performed. After processing the wafer W1 in evaluation tests 5-1 and 5-2, the percentage of occurrence of pattern collapse, the number of developing defects and the kind of developing defects were investigated.

Figure 25:
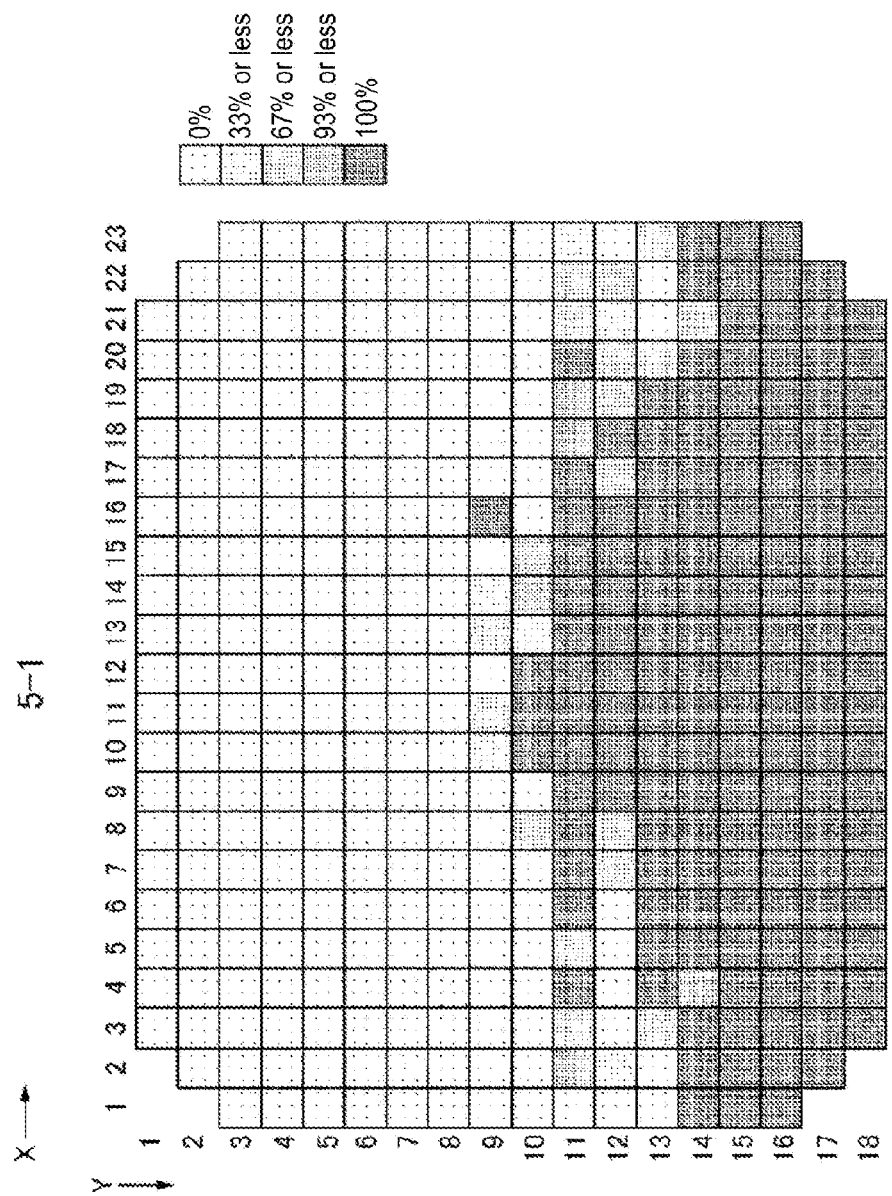
FIG. 25 is a distribution map of pattern collapse percentages obtained in the evaluation tests.
Figure 26:
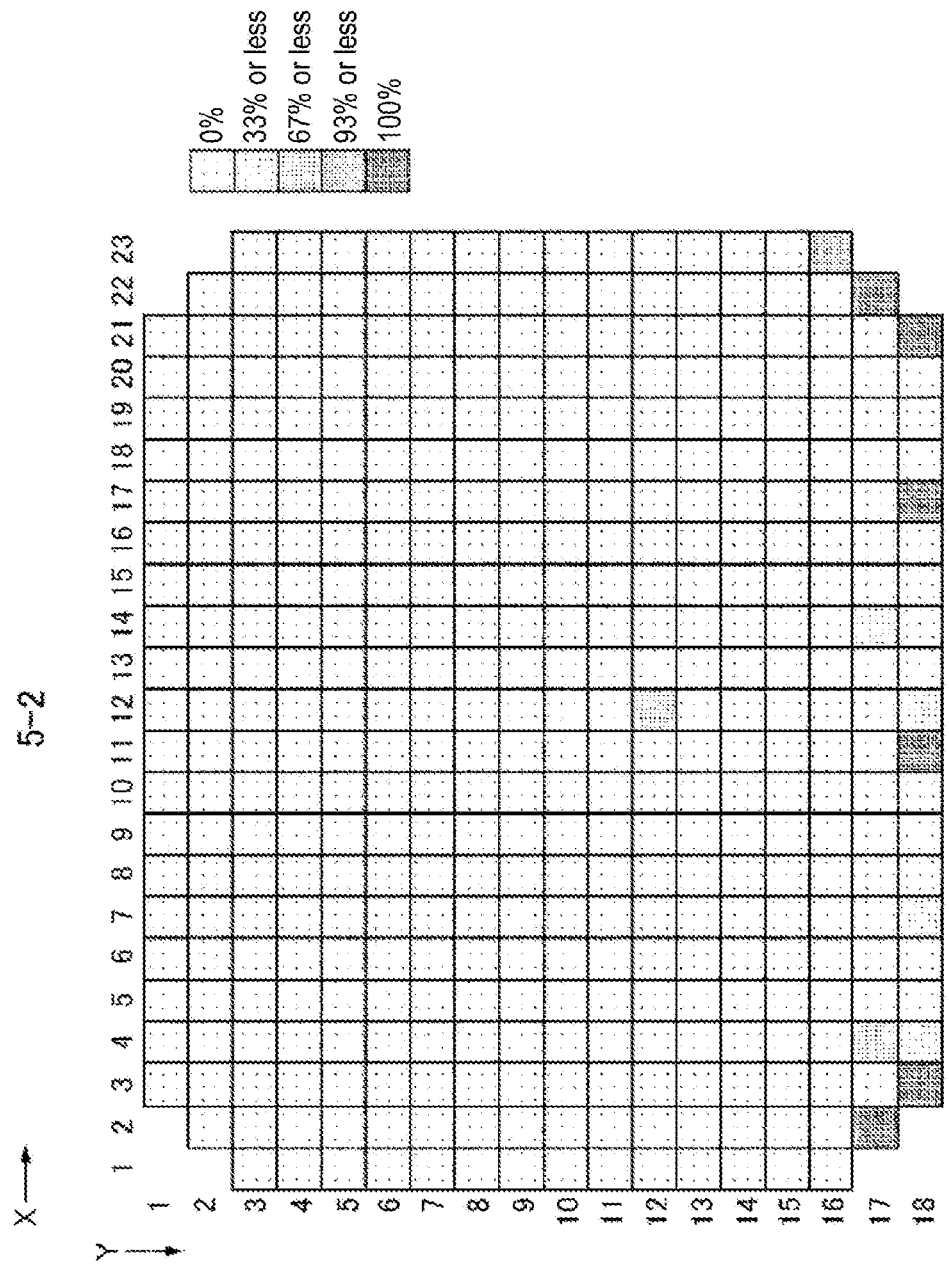
FIG. 26 is a distribution map of pattern collapse percentages obtained in the evaluation tests.

As with evaluation test 3, the pattern collapse percentages of evaluation test 5-1 are shown in FIG. 25 and the pattern collapse percentages of evaluation test 5-2 are shown in FIG. 26. As is apparent from the comparison of FIGS. 25 and 26, in evaluation test 5-2, as compared with evaluation test 5-1, the pattern collapse is suppressed over the entire surface of the wafer W1. If the critical CD is calculated in the same manner as in evaluation test 3, the critical CD of evaluation test 5-1 is 36.9 nm and the critical CD of evaluation test 5-2 is 34.4 nm. In evaluation test 5-2, as compared with evaluation test 5-1, the critical CD is increased by 6.8%.

Regarding the developing defects, the number of developing defects of evaluation test 5-2 was reduced to about 1/7 of the number of developing defects of evaluation test 5-1. As for the kind of developing defects, the ratio of the number of defects attributable to the remaining liquid to the number of all defects was 63.0% in evaluation test 5-1. However, the developing defects attributable to the remaining liquid were not generated in evaluation test 5-2. In evaluation test 5-1, the places where the developing defects are generated were leaning toward the central portion and the peripheral edge portion of the wafer W1. However, such leaning did not occur in evaluation test 5-2. The results of evaluation tests 5-1 and 5-2 reveal that, if the drying is performed by forming the dry region 30, it is possible to prevent the replacing liquid 33B from remaining on the wafer W1 and, consequently, to prevent generation of the developing defects and occurrence of the pattern collapse.

(Evaluation Test 6)

In evaluation test 6-1, the wafer W1 was processed in the same manner as in the first processing method of the embodiment. Differing points reside in that, after stopping the supply of the replacing liquid 33B, the $N_2$ gas is discharged while rotating the wafer W1 at 1500 rpm for 0.5 seconds and then the revolution number of the wafer W1 is increased to 2000 rpm. Even after increasing the revolution number, the discharge of the $N_2$ gas to the wafer W1 was continuously performed for 1 second. The discharge of the $N_2$ gas was stopped and the revolution number of the wafer W1 was reduced from 2000 rpm. In evaluation test 6-2, the wafer W1 was processed substantially in the same manner as in evaluation test 6-1. Unlike evaluation test 6-1, evaluation test 6-2 set the time in increasing the revolution number to 2000 rpm and then reducing the revolution number from 2000 rpm to be equal to 4 seconds during which the $N_2$ gas was discharged. That is to say, the discharge of the $N_2$ gas was performed for 0.5 seconds plus 4 seconds. In evaluation tests 6-1 and 6-2, the percentages of occurrence of pattern collapse in the respective exposure regions 61 of the processed wafer W1 were investigated.

Figure 27:
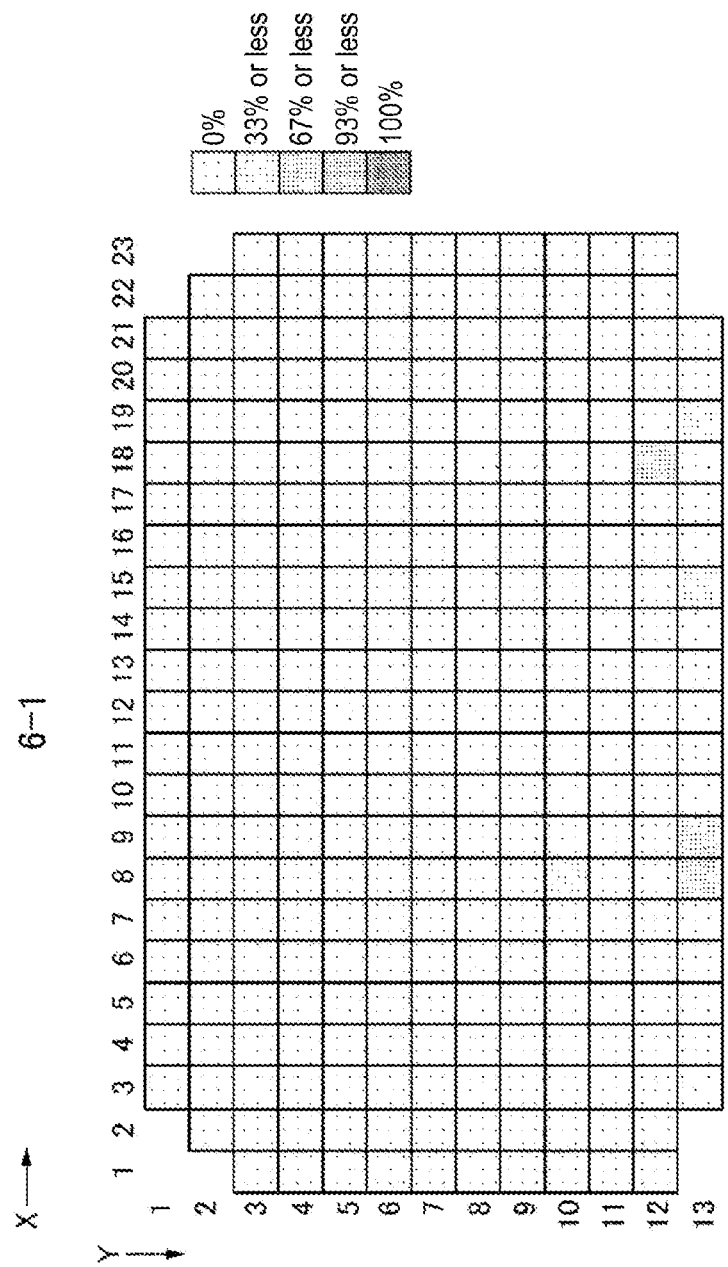
FIG. 27 is a distribution map of pattern collapse percentages obtained in the evaluation tests.
Figure 28:
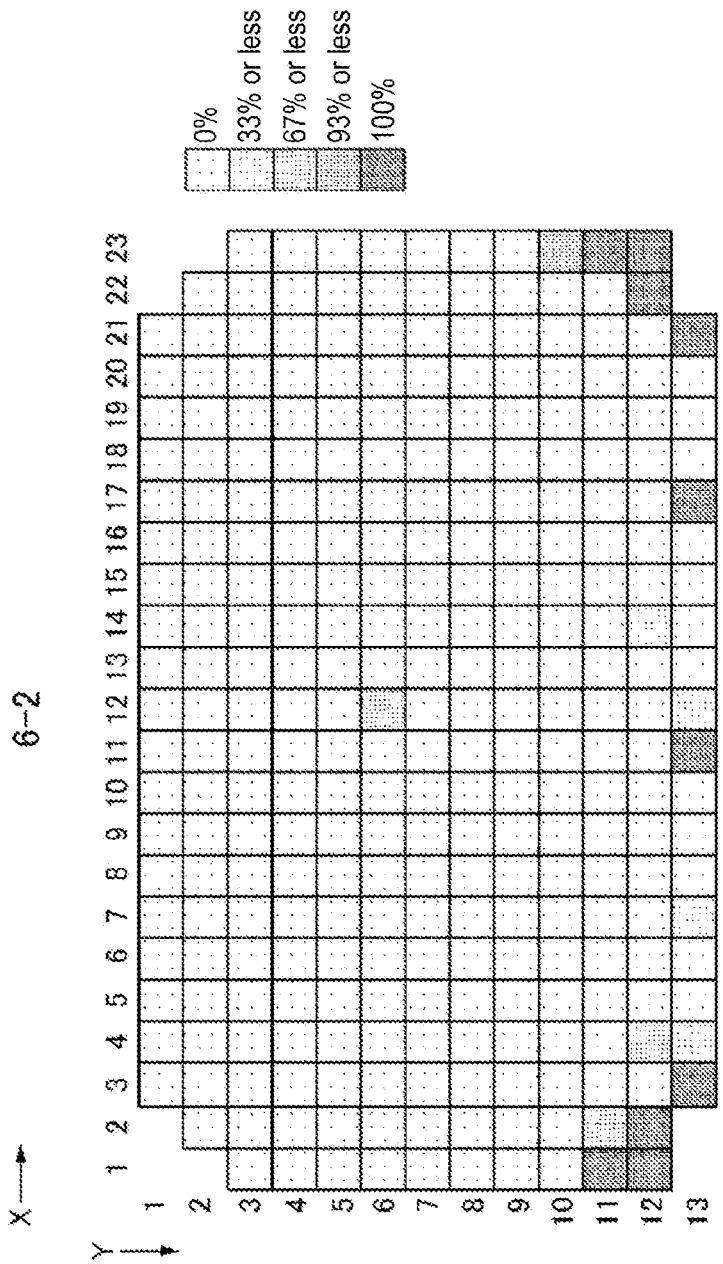
FIG. 28 is a distribution map of pattern collapse percentages obtained in the evaluation tests.

The pattern collapse percentages of evaluation test 6-1 are shown in FIG. 27 and the pattern collapse percentages of evaluation test 6-2 are shown in FIG. 28. In evaluation tests 6-1 and 6-2, the pattern collapse was relatively suppressed over the entire surface of the wafer W1. In evaluation test 6-2, the pattern collapse not observed in evaluation test 6-1 was identified in the central portion of the wafer W1 (in the exposure region 61 having X-direction serial number 12 and Y-direction serial number 6).

Figure 29:
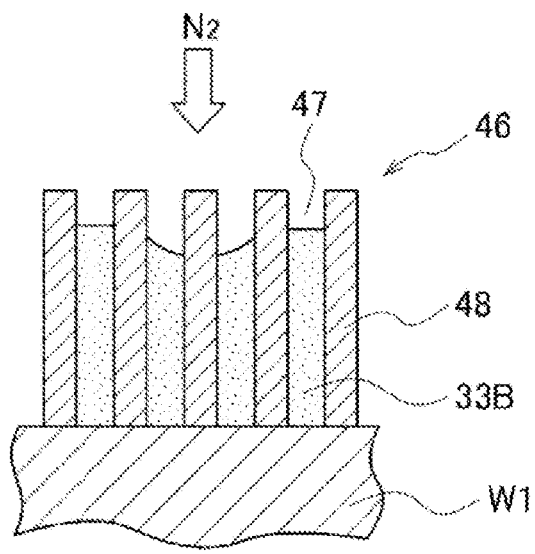
FIG. 29 is a schematic view of a resist pattern which is being processed in the evaluation tests.
Figure 30:
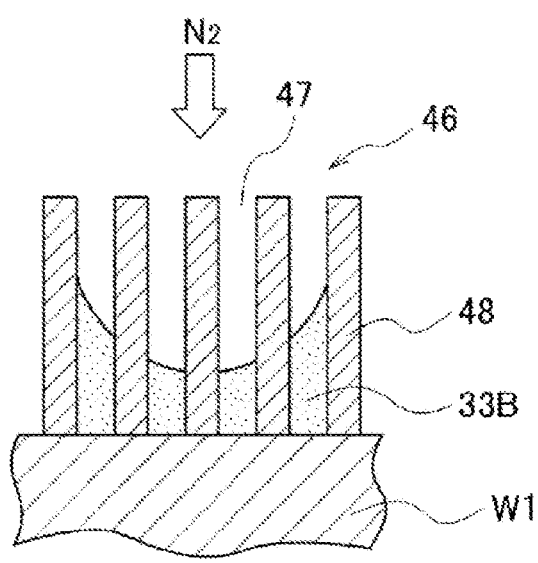
FIG. 30 is a schematic view of a resist pattern which is being processed in the evaluation tests.

The reason why the pattern collapse occurs in the central portion of the wafer W1 in evaluation test 6-2 will be described with reference to FIGS. 29 and 30. FIGS. 29 and 30 are schematic views of the resist patterns 46 in the central portion of the wafer W1 to which the $N_2$ gas is supplied in evaluation tests 6-1 and 6-2. In evaluation test 6-1, the discharge time of the $N_2$ gas is appropriate and the uniformity of the liquid surface height of the replacing liquid 33B retained in the recess portions 47 of the resist patterns 46 is high. Accordingly, it is considered that the stresses applied to the wall portions 48 of the resist patterns 46 by the surface tension of the replacing liquid existing in one recess portion 47 act so as to cancel the stresses applied to the wall portions 48 of the resist patterns 46 by the surface tension of the replacing liquid existing in another recess portion 47. This prevents strong stresses from being exerted on the wall portions 48, thereby preventing an occurrence of pattern collapse.

However, in evaluation test 6-2, the discharge time of the $N_2$ gas is relatively long. Thus, the dryness varies in the respective recess portions 47 of the resist patterns 46. The variation in the liquid surface height of the replacing liquid 33B retained in the respective recess portions 47 becomes larger. Consequently, the stresses applied to the wall portions 48 of the resist patterns 46 by the surface tension of the replacing liquid 33B existing in the respective recess portions 47 vary. As a result, it appears that strong stresses acting in a specific direction are exerted on the wall portions 48, thereby causing pattern collapse. Evaluation test 6 reveals that, if the discharge time of the $N_2$ gas is set to be substantially equal to that used in evaluation test 6-1, e.g., 1 second to 2 seconds, the pattern collapse does not occur in the central portion of the wafer W.

(Evaluation Test 7)

In evaluation test 7-1, the wafer W1 was processed in the same manner as in evaluation test 6-2. That is to say, the discharge of the $N_2$ gas was started when the revolution number of the wafer W1 is 1500 rpm. Thereafter, the revolution number was increased to 2000 rpm while continuously performing the discharge of the $N_2$ gas. The discharge of the $N_2$ gas was further performed while rotating the wafer W1 at 2000 rpm. In evaluation test 7-2, the wafer W1 was processed substantially in the same manner as in evaluation test 7-1. The processing was performed by increasing the revolution number of the wafer W1 from 1500 rpm to 2500 rpm rather than 2000 rpm. In evaluation tests 7-1 and 7-2, the percentages of occurrence of pattern collapse in the respective exposure regions 61 of the processed wafer W1 were investigated.

Figure 31:
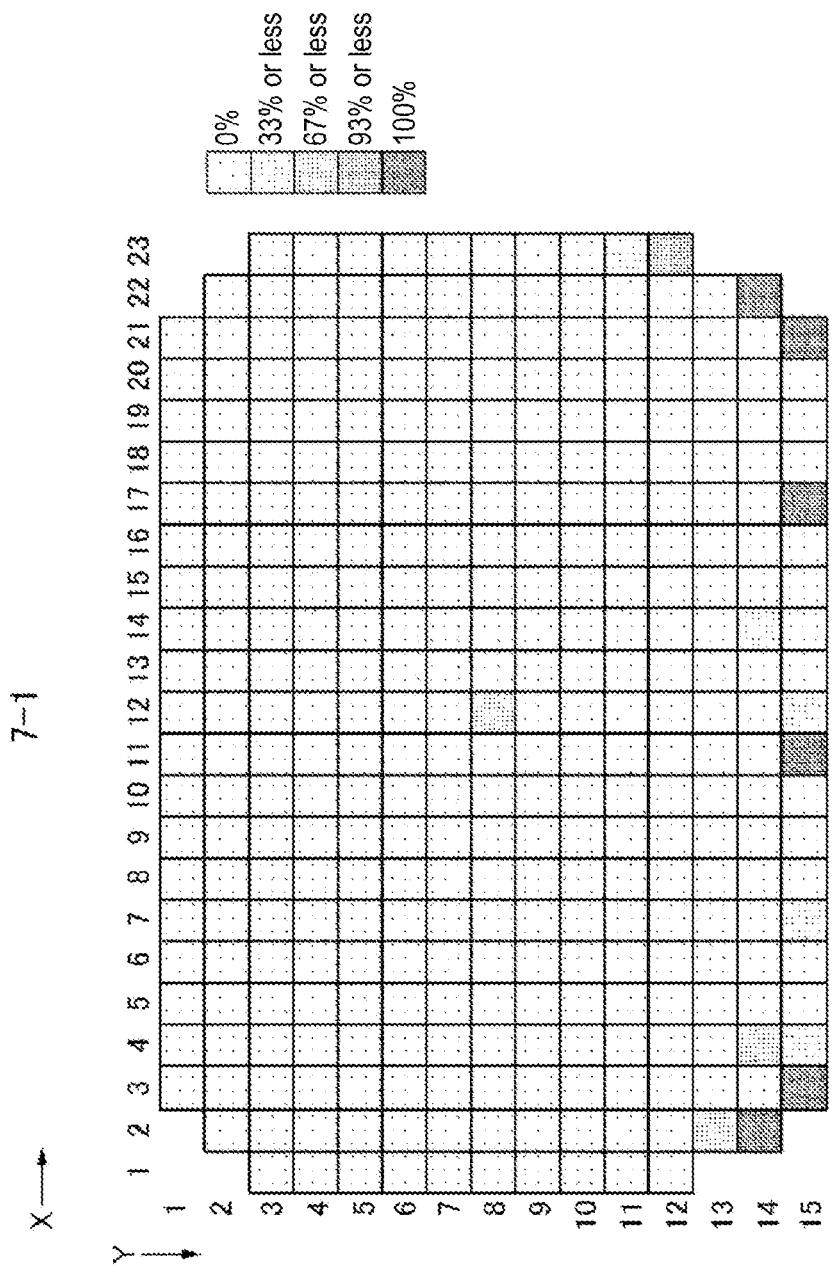
FIG. 31 is a distribution map of pattern collapse percentages obtained in the evaluation tests.
Figure 32:
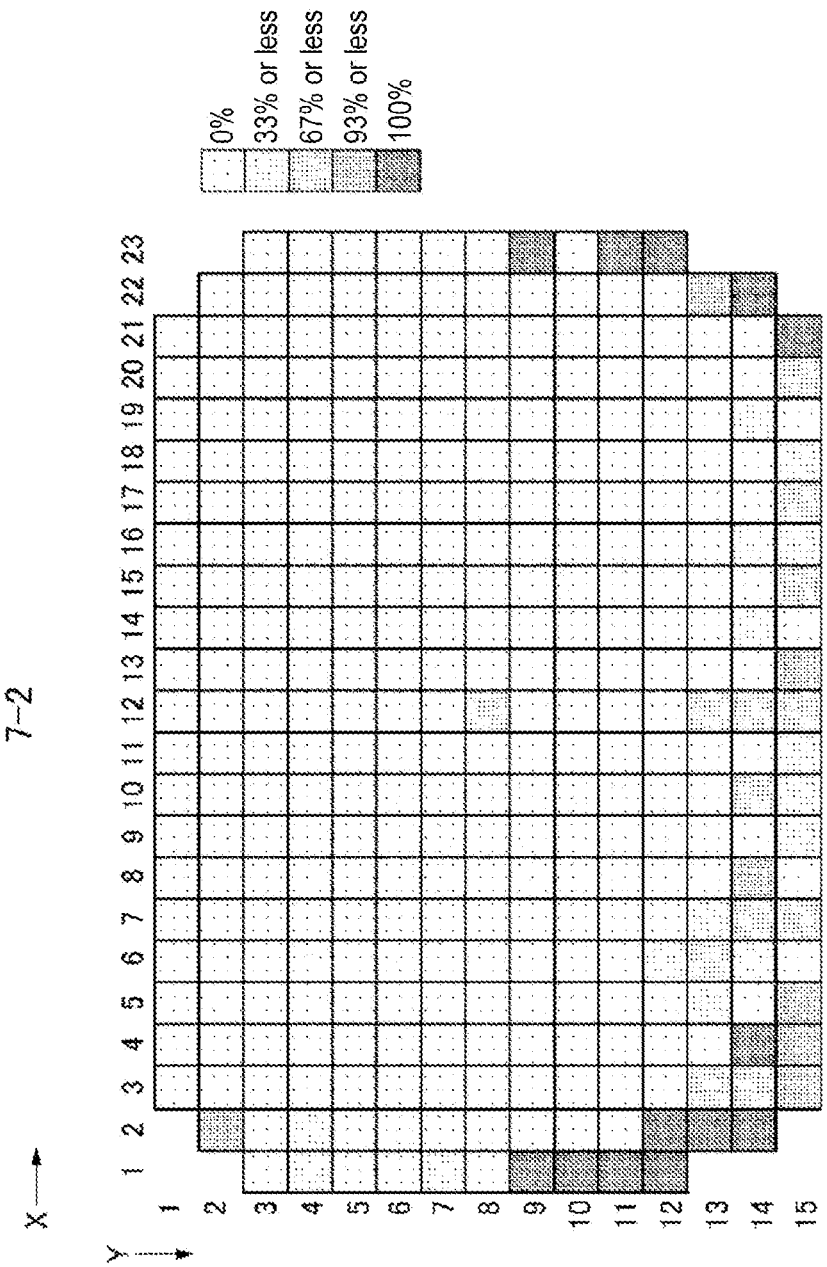
FIG. 32 is a distribution map of pattern collapse percentages obtained in the evaluation tests.

The pattern collapse occurrence percentages of evaluation test 7-1 are shown in FIG. 31 and the pattern collapse occurrence percentages of evaluation test 7-2 are shown in FIG. 32. In evaluation tests 7-1 and 7-2, the pattern collapse was relatively suppressed. In evaluation test 7-2, as compared with evaluation test 7-1, the number of the exposure regions 61 where the pattern collapse occurs is increased in the peripheral edge portion of the wafer W1. In particular, the pattern collapse frequently occurs in the exposure regions 61 having X-direction serial numbers 1 and 2 and in the exposure regions 61 having Y-direction serial numbers 13, 14 and 15. In evaluation test 7-2, the revolution number of the wafer W1 is high. Thus, a turbulence flow is generated on the peripheral edge portion of the wafer W. It is considered that the drying is performed by the turbulence flow before the dry region 30 reaches the peripheral edge portion. Consequently, it appears that the dryness of the replacing liquid 33B becomes uneven and the pattern collapse occurs. It is considered that a relatively high revolution number is needed in order to break the liquid film and to form the dry region 30. If the revolution number of the wafer W1 during the gas discharge is set higher than the revolution number used in evaluation test 7-2, the pattern collapse is further increased in the peripheral edge portion of the wafer W1. It is therefore preferred that the revolution number of the wafer W1 during the discharge of the $N_2$ gas is set to be equal to 1500 rpm to 2500 rpm.

(Evaluation Test 8)

In evaluation test 8-1, the wafer W1 was processed according to the first processing method of the aforementioned embodiment. That is to say, the discharge of the $N_2$ gas was performed at the revolution number of the wafer W1 of 2000 rpm. After the discharge of the $N_2$ gas is stopped, the revolution number of the wafer W1 was reduced to 1500 rpm and the dry region 30 was expanded toward the outer periphery of the wafer W1. In evaluation test 8-1, after the discharge of the $N_2$ gas is stopped, the dry region 30 was expanded toward the outer periphery of the wafer W1 without reducing the revolution number of the wafer W1 from 2000 rpm to 1500 rpm. In evaluation test 8-2, the processing was performed in the same manner as in evaluation test 8-1 except that the revolution number is not reduced. In evaluation tests 8-1 and 8-2, the percentages of occurrence of pattern collapse in the respective exposure regions 61 and the situations of generation of developing defects were investigated with respect to the processed wafers W.

Figure 33:
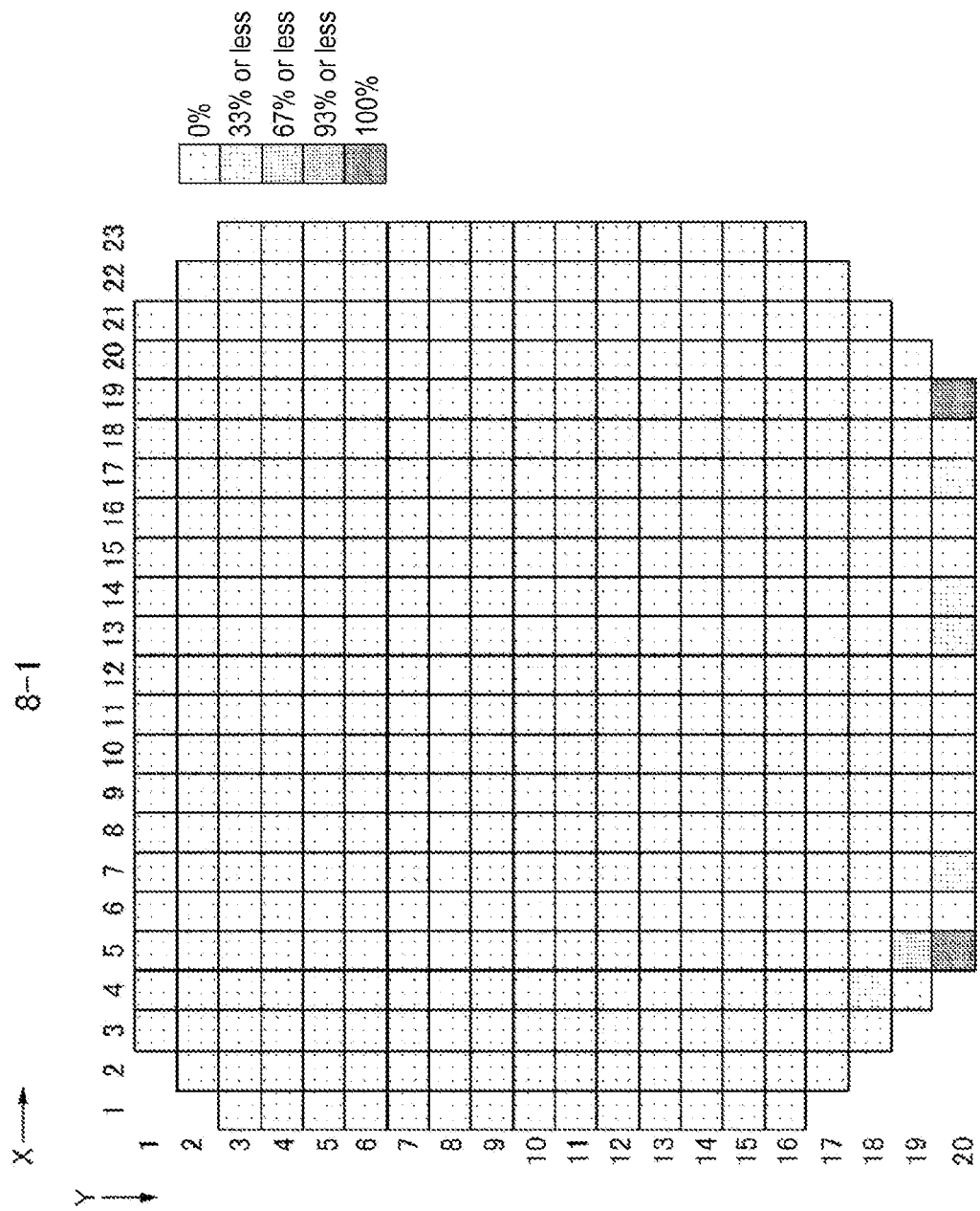
FIG. 33 is a distribution map of pattern collapse percentages obtained in the evaluation tests.
Figure 34:
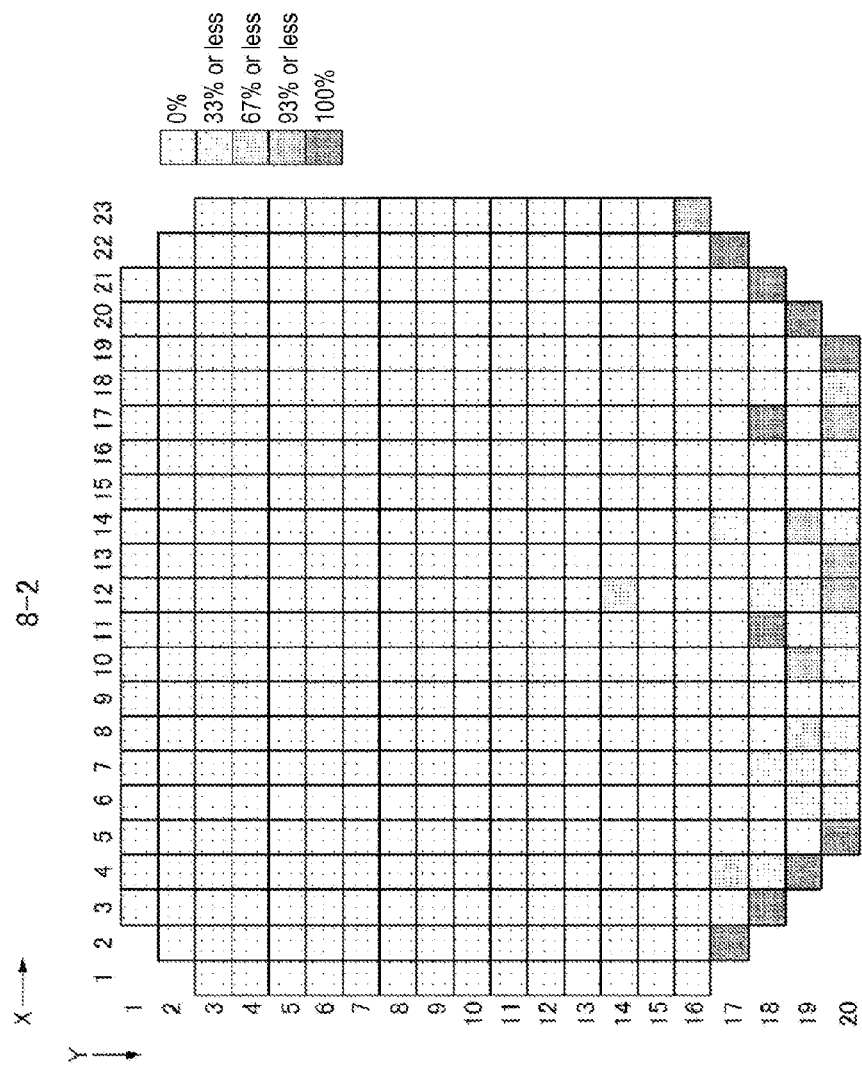
FIG. 34 is a distribution map of pattern collapse percentages obtained in the evaluation tests.

The pattern collapse occurrence percentages of evaluation test 8-1 are shown in FIG. 33 and the pattern collapse occurrence percentages of evaluation test 8-2 are shown in FIG. 34. As shown in FIGS. 33 and 34, in evaluation test 8-2, as compared with evaluation test 8-1, the pattern collapse occurrence percentages are increased in the exposure regions 61 in which the patterns having a small line width are formed, namely in the exposure regions 61 having Y-direction serial numbers 18, 19 and 20 in FIG. 34 and existing in the peripheral edge portion of the wafer W. The critical CD of evaluation test 8-1 is 34.0 nm and the critical CD of evaluation test 8-2 is 34.4 nm. The number of developing defects is larger in evaluation test 8-2 than in evaluation test 8-1.

Presumably, the reason for this result being obtained is that, in evaluation test 8-2, a turbulence flow is generated on the peripheral edge portion of the wafer W1 as described in evaluation test 7 and the peripheral edge portion of the wafer W1 is dried by the turbulence flow before the dry region 30 reaches the peripheral edge portion. Evaluation test 8 reveals that it is preferable in some embodiments to, after forming the dry region 30, reduce the revolution number of the wafer W1 before the dry region 30 reaches the peripheral edge portion of the wafer W1.

(Evaluation Test 9)

In evaluation test 9-1, the wafer W1 was processed according to the first processing method of the aforementioned embodiment. That is to say, the discharge of the $N_2$ gas was performed at the revolution number of the wafer W1 of 2000 rpm. The discharge of the $N_2$ gas is stopped during the rotation of the wafer W1 at 2000 rpm. At a specified timing after the stoppage of the discharge of the $N_2$ gas, the revolution number of the wafer W1 was set at a predetermined revolution number. The dry region 30 was expanded toward the peripheral edge portion of the wafer W1. Thereafter, the rotation of the wafer W1 was stopped. The predetermined revolution number was set to be equal to 500 rpm rather than 1500 rpm.

In evaluation test 9-2, the wafer W1 was processed in the same manner as in evaluation test 9-1 except that the predetermined revolution number is set to be equal to 1000 rpm. In evaluation test 9-3, the wafer W1 was processed in the same manner as in evaluation test 9-1 except that the predetermined revolution number is set to be equal to 1500 rpm. That is to say, evaluation test 9-3 is the same processing method as the first processing method described above. In evaluation test 9-4, the wafer W1 was processed in the same manner as in evaluation test 9-1 except that the predetermined revolution number is set to be equal to 2000 rpm. That is to say, in evaluation test 9-4, after stopping the discharge of the $N_2$ gas, the revolution number was not reduced until the $N_2$ gas reaches the peripheral edge portion of the wafer W1. In evaluation tests 9-1 to 9-4, the time period from the specified timing to the time at which the rotation at the predetermined revolution number is stopped is set to be equal to 15 seconds. In evaluation tests 9-1 to 9-4, the percentages of occurrence of pattern collapse in the respective exposure regions 61 were investigated with respect to the processed wafers W1.

Figure 35:
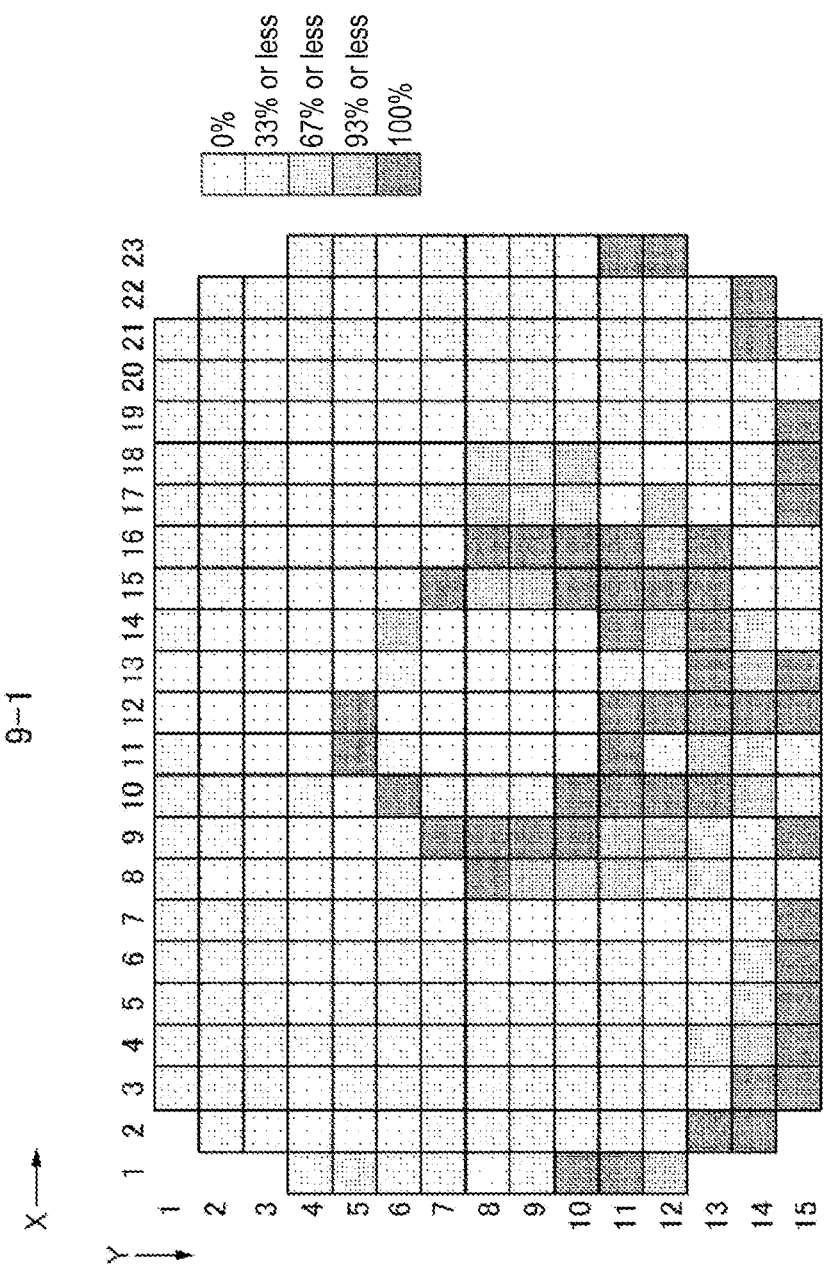
FIG. 35 is a distribution map of pattern collapse percentages obtained in the evaluation tests.
Figure 36:
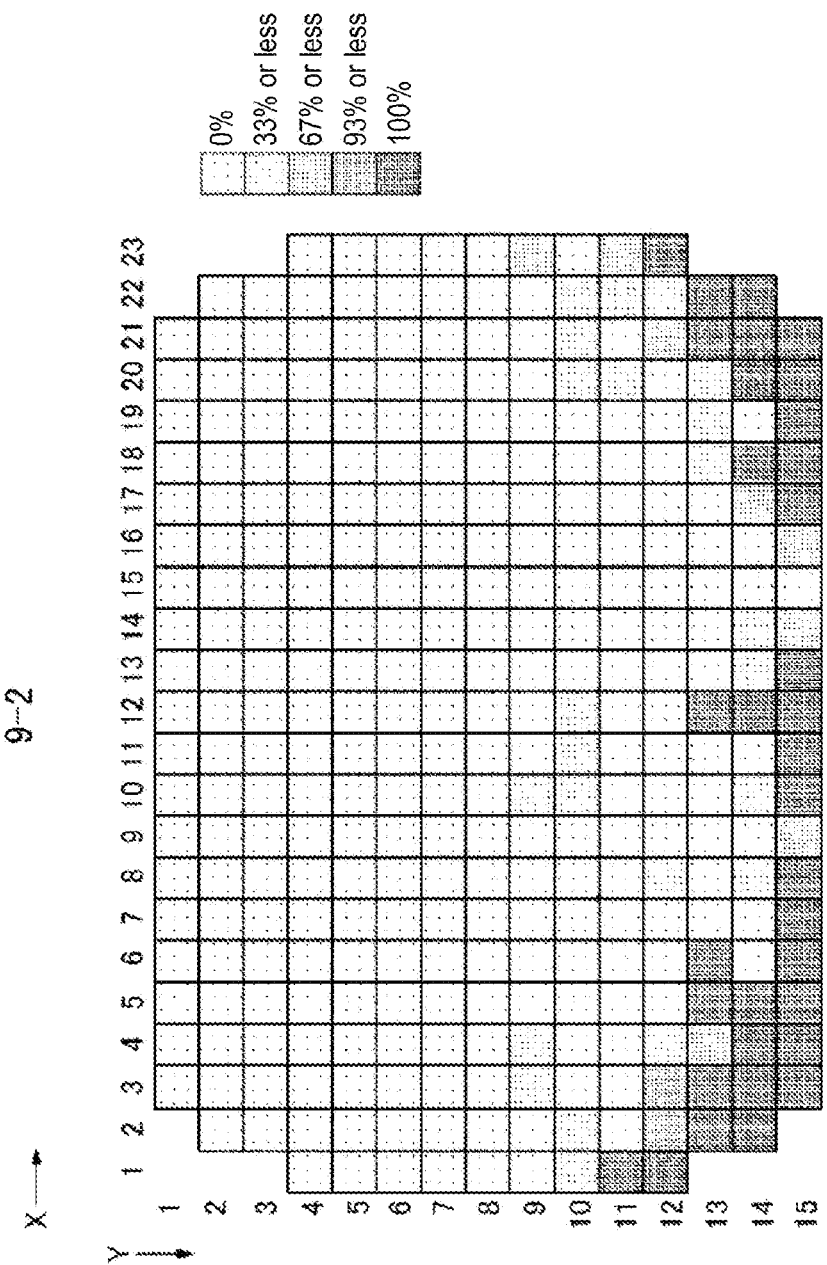
FIG. 36 is a distribution map of pattern collapse percentages obtained in the evaluation tests.
Figure 37:
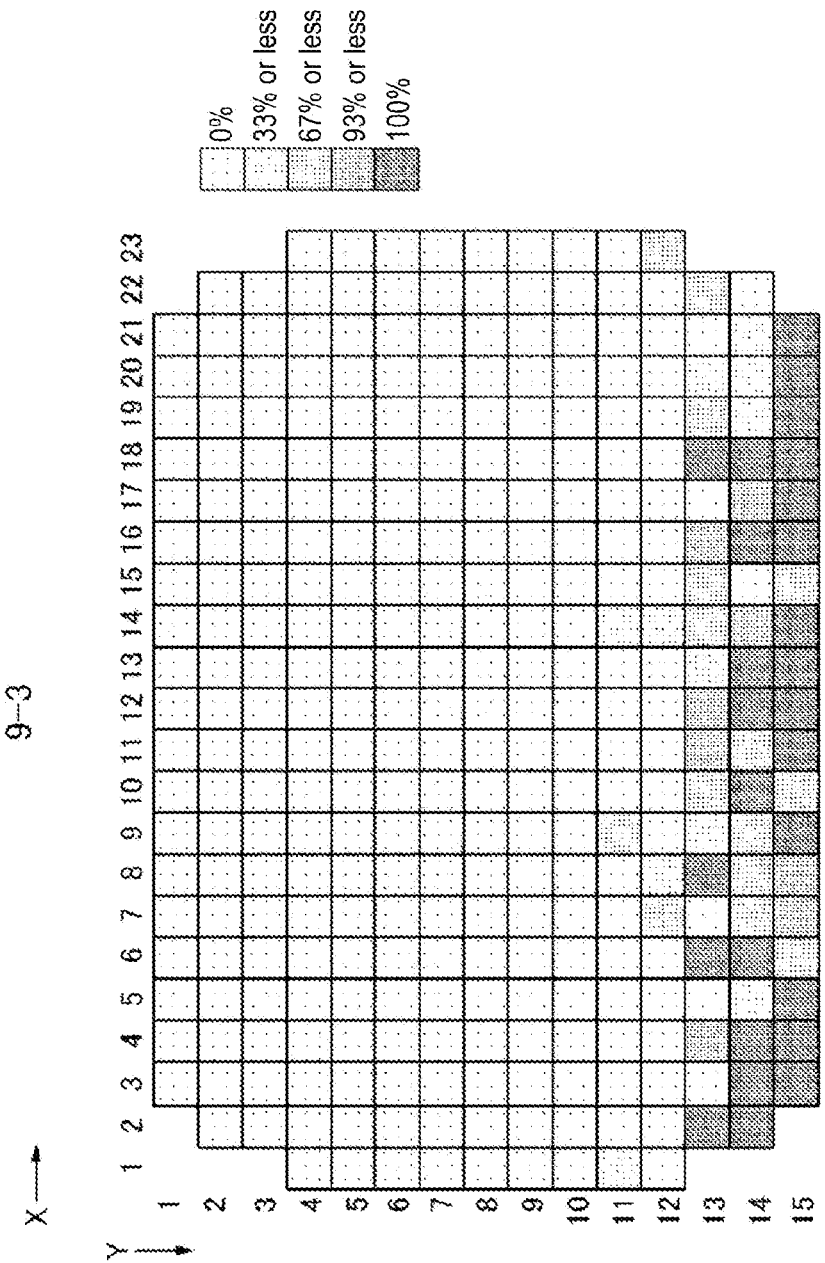
FIG. 37 is a distribution map of pattern collapse percentages obtained in the evaluation tests.
Figure 38:
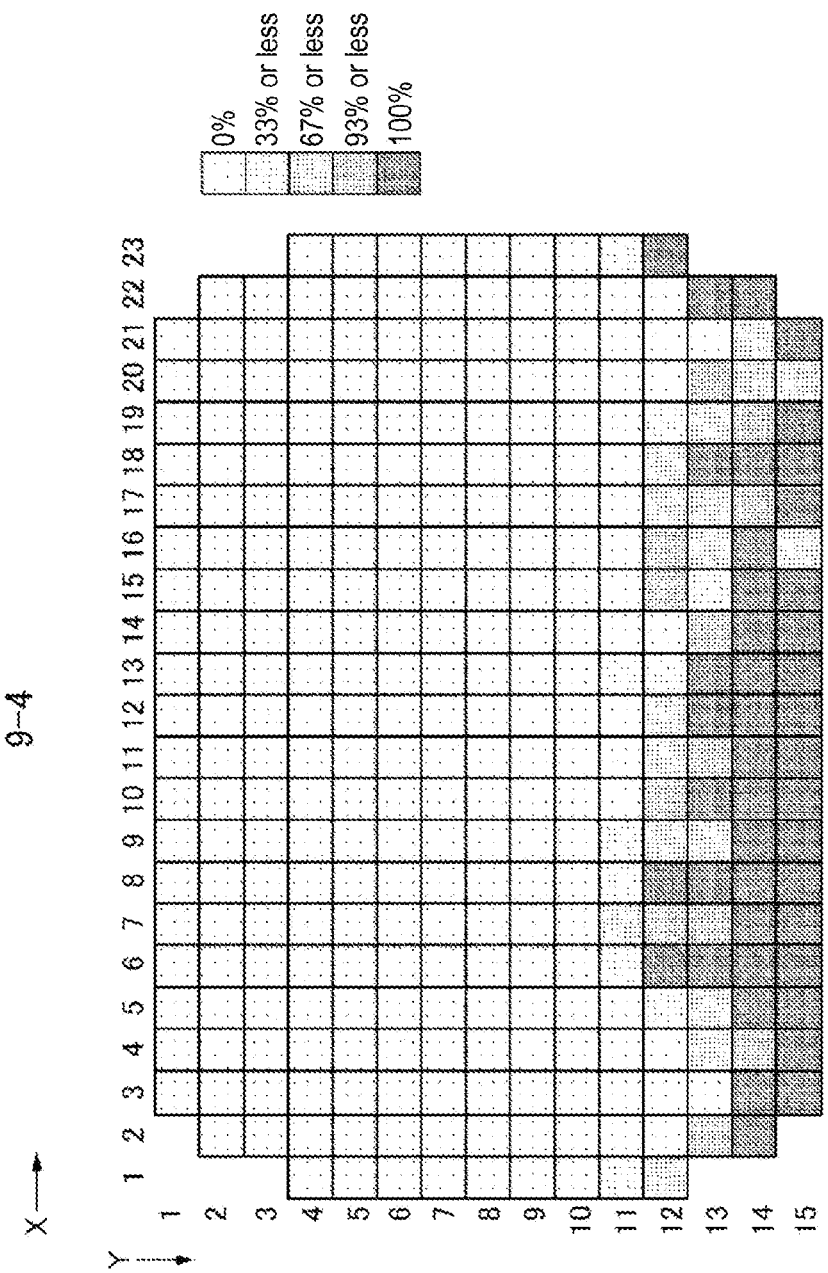
FIG. 38 is a distribution map of pattern collapse percentages obtained in the evaluation tests.

The pattern collapse percentages of evaluation tests 9-1, 9-2, 9-3 and 9-4 are respectively shown in FIGS. 35, 36, 37 and 38. As shown in FIG. 35, in evaluation test 9-1, the pattern collapse occurs in a large number of exposure regions 61 existing in the peripheral edge portion of the wafer W1. Presumably, this is because, during the rotation of the wafer W1 at the low revolution number of 500 rpm, the dry region 30 fails to reach the peripheral edge portion of the wafer W1. As shown in FIG. 36, in evaluation test 9-2, as compared with evaluation test 9-1, the pattern collapse is suppressed. However, even if the dose amount is relatively low, the pattern collapse occurs in the exposure regions 61 existing in the peripheral edge portion of the wafer W1. Presumably, this is because, as in evaluation test 9-1, the dry region 30 fails to reach the peripheral edge portion of the wafer W1. As shown in FIGS. 37 and 38, in evaluation tests 9-3 and 9-4, the pattern collapse occurs in the central portion and the peripheral edge portion of the wafer W1 as long as the high dose amount regions are present. However, the pattern collapse is suppressed in the central portion and the peripheral edge portion of the wafer W1 as long as the low dose amount regions are present. Accordingly, evaluation test 9 reveals that, when expanding the dry region 30 toward the peripheral edge portion of the wafer W1 after the formation of the dry region 30, it is preferable in some embodiments to rotate the wafer W1 at a revolution number of 1500 rpm or more.

(Evaluation Test 10)

In evaluation test 10-1, just like the first processing method described above, the discharge of the $N_2$ gas is performed at the revolution number of the wafer W1 of 2000 rpm. The discharge of the $N_2$ gas is stopped during the rotation of the wafer W1 at 2000 rpm. At a specified timing after the stoppage of the discharge of the $N_2$ gas, the revolution number of the wafer W1 is reduced to 1500 rpm. After a predetermined time elapses from the time point at which the revolution number is reduced, the revolution number of the wafer W1 is reduced to 0 rpm. The predetermined time was set equal to 5 seconds. In evaluation test 10-2, the wafer W1 was processed in the same manner as in evaluation test 10-1 except that the predetermined time is set equal to 10 seconds. In evaluation test 10-3, the wafer W1 was processed in the same manner as in evaluation test 10-1 except that the predetermined time is set equal to 15 seconds. In evaluation tests 10-1 to 10-3, the percentages of occurrence of pattern collapse in the respective exposure regions 61 were investigated with respect to the processed wafers W1.

Figure 39:
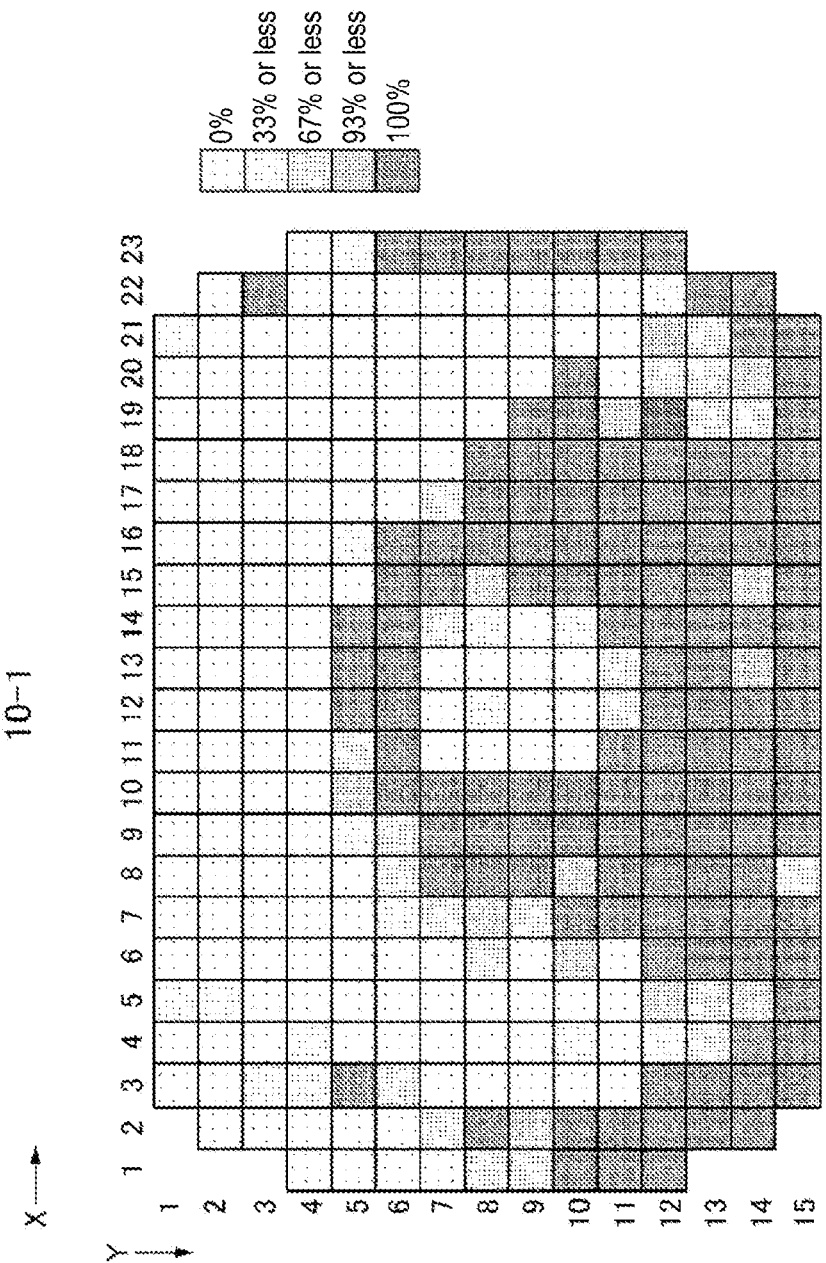
FIG. 39 is a distribution map of pattern collapse percentages obtained in the evaluation tests.
Figure 40:
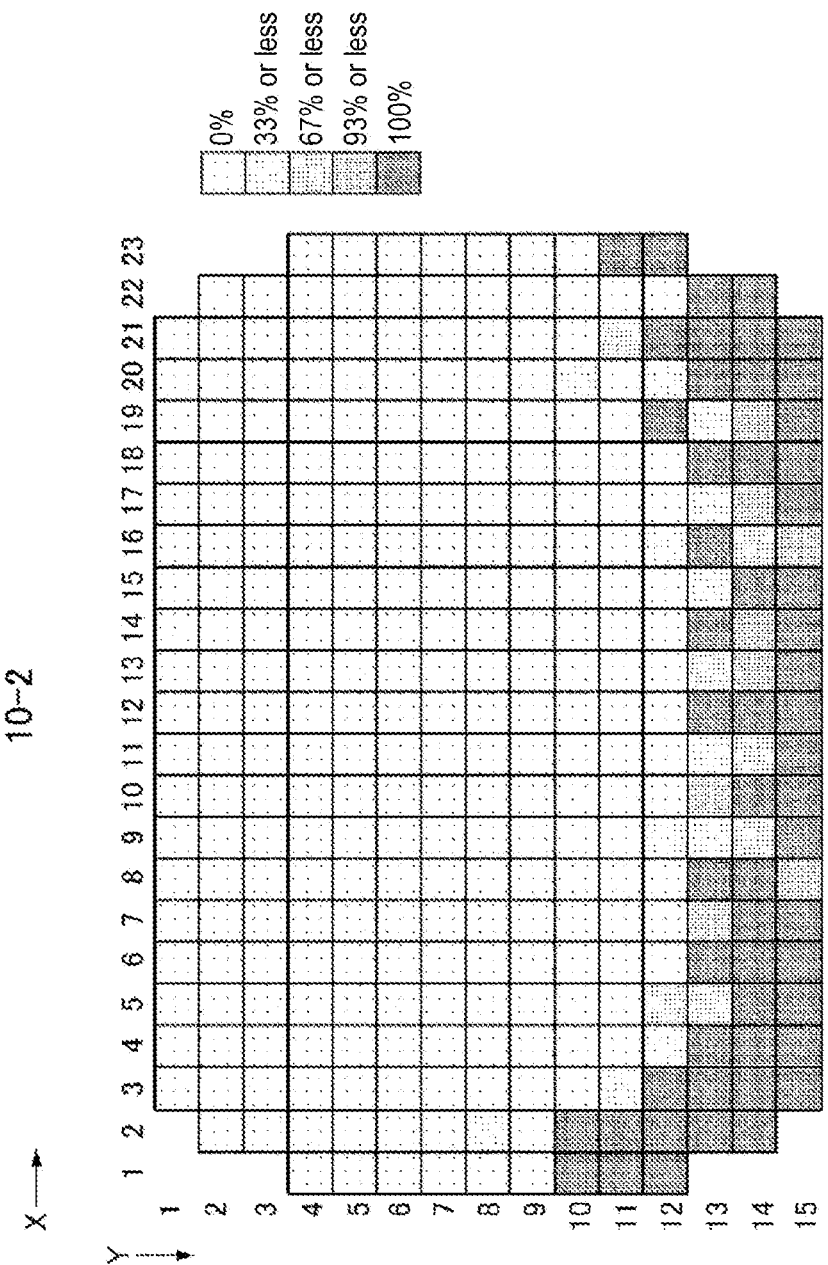
FIG. 40 is a distribution map of pattern collapse percentages obtained in the evaluation tests.
Figure 41:
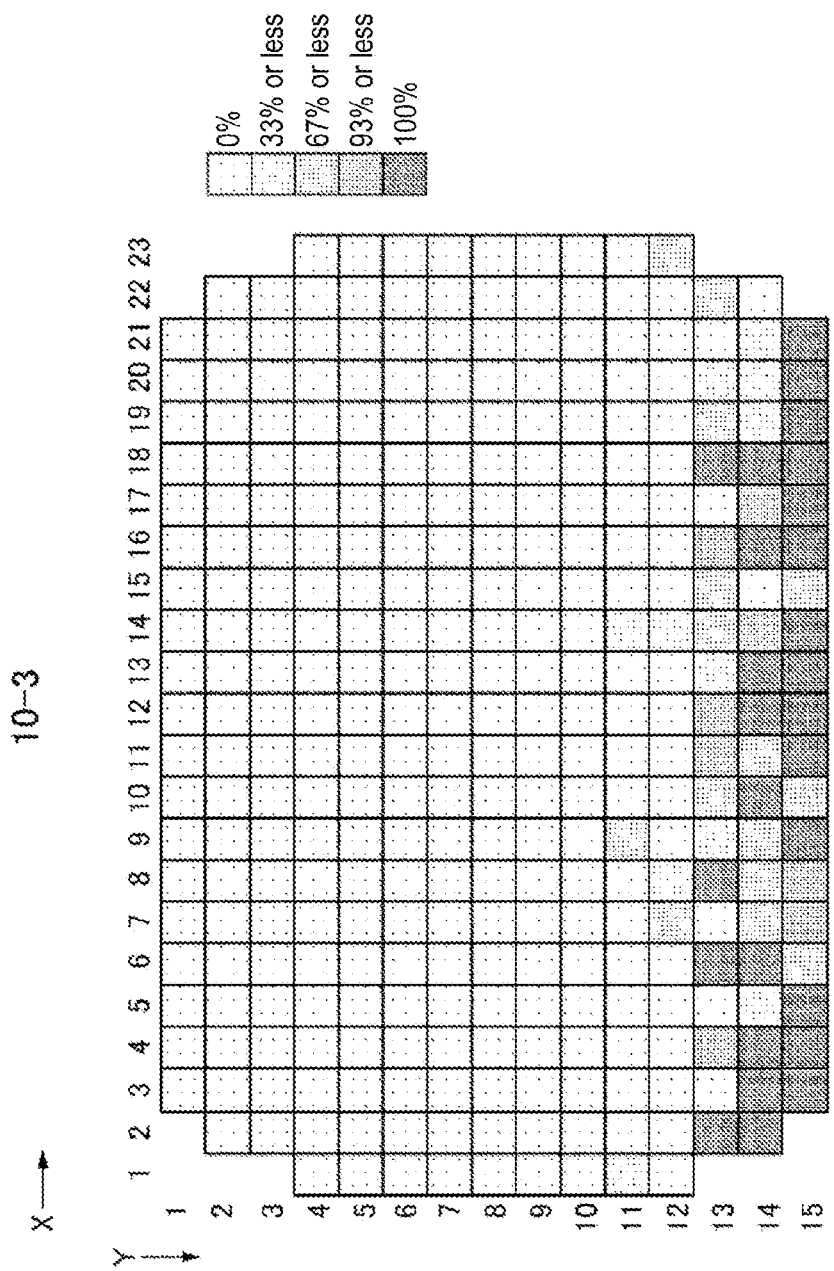
FIG. 41 is a distribution map of pattern collapse percentages obtained in the evaluation tests.

The pattern collapse percentages of evaluation tests 10-1, 10-2 and 10-3 are respectively shown in FIGS. 39, 40 and 41. As shown in FIG. 39, in evaluation test 10-1, the pattern collapse occurs in a large number of exposure regions 61 existing in the peripheral edge portion of the wafer W1. Presumably, this is because the time for expanding the dry region 30 is short and the dry region 30 fails to reach the peripheral edge portion of the wafer W1. As shown in FIG. 40, in evaluation test 10-2, as compared with evaluation test 10-1, the pattern collapse is suppressed. However, even if the dose amount is relatively low, the pattern collapse occurs in the exposure regions 61 existing in the peripheral edge portion of the wafer W1. Presumably, this is because, as in evaluation test 10-1, the dry region 30 fails to reach the peripheral edge portion of the wafer W1. As shown in FIG. 41, in evaluation test 10-3, the pattern collapse occurs in the central portion and the peripheral edge portion of the wafer W1 as long as the high dose amount regions 61 are concerned. However, the pattern collapse is suppressed in the central portion and the peripheral edge portion of the wafer W1 as long as the low dose amount regions are present. Accordingly, evaluation test 10 reveals that it is preferable in some embodiments to rotate the wafer W1 for 15 seconds or more after forming the dry region 30 and reducing the revolution number of the wafer W1, thereby expanding the dry region 30 to the peripheral edge portion of the wafer W1 and centrifugally removing the replacing liquid 33B from the wafer W1.

(Evaluation Test 11)

In evaluation test 11-1, the wafer W1 was processed according to the first processing method of the aforementioned embodiment. That is to say, the discharge position of the $N_2$ gas was fixed to the central portion of the wafer W1. In evaluation test 11-2, the wafer W1 was processed according to the second processing method of the aforementioned embodiment. That is to say, after discharging the $N_2$ gas to the central portion of the wafer W1, the gas nozzle 34 was moved so as to move the discharge position of the $N_2$ gas toward the peripheral edge portion of the wafer W1. In evaluation tests 11-1 and 11-2, the percentages of occurrence of pattern collapse in the respective exposure regions 61 were investigated with respect to the processed wafers W1.

Figure 42:
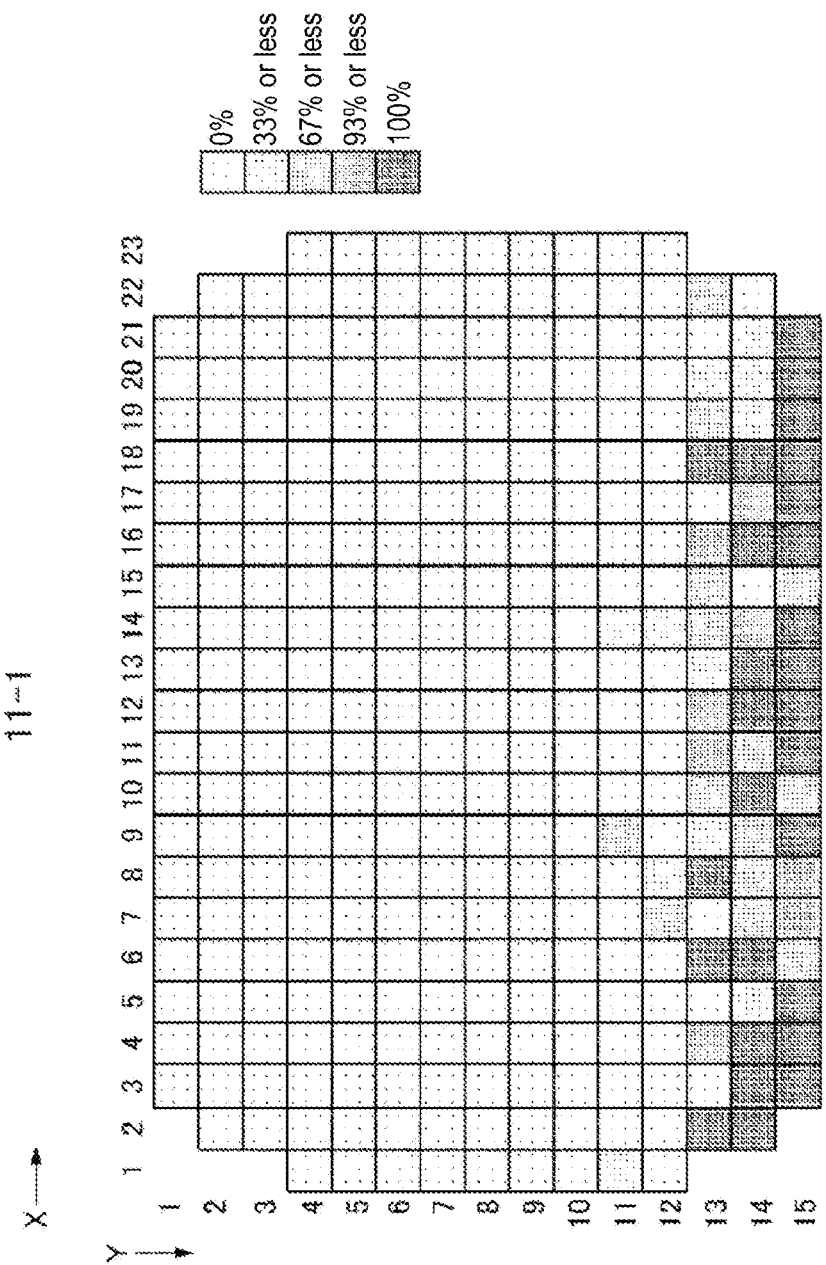
FIG. 42 is a distribution map of pattern collapse percentages obtained in the evaluation tests.
Figure 43:
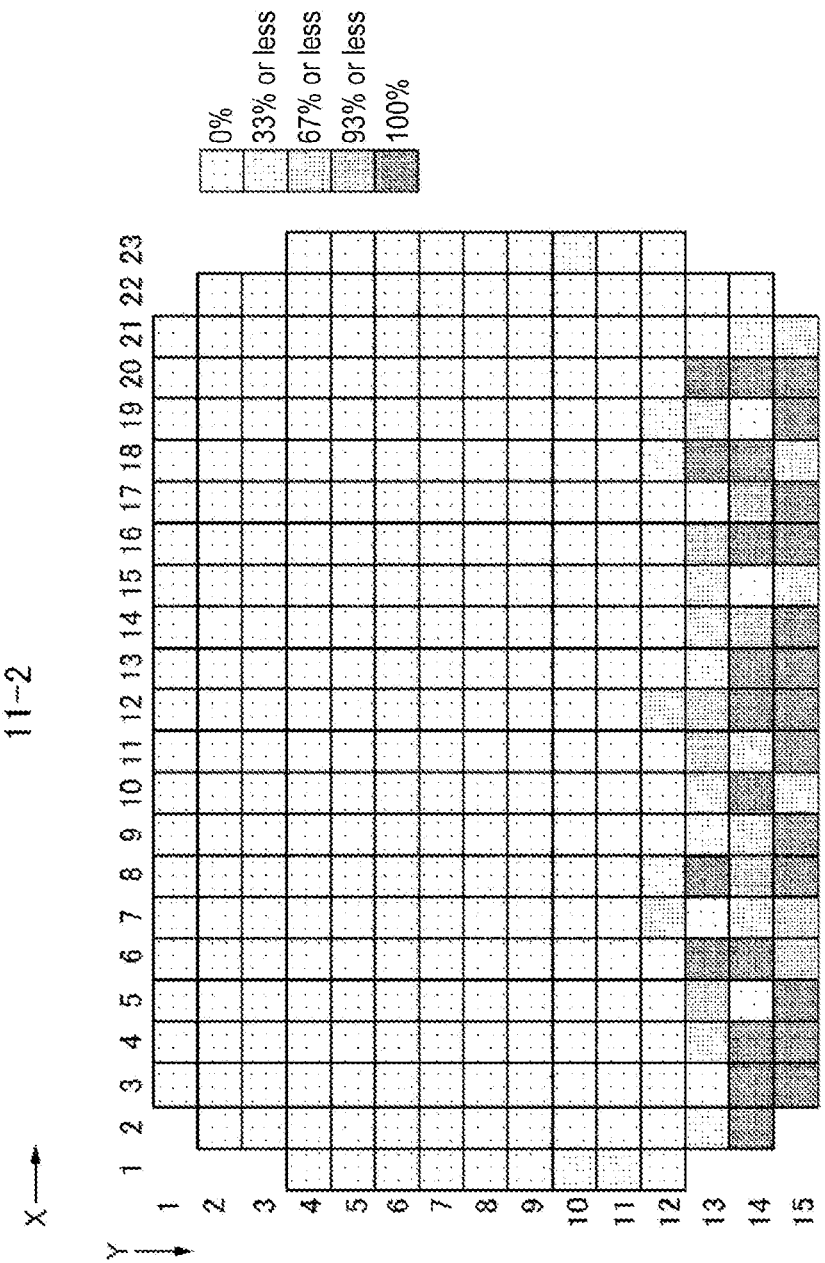
FIG. 43 is a distribution map of pattern collapse percentages obtained in the evaluation tests.

The pattern collapse percentages of evaluation tests 11-1 and 11-2 are shown in FIGS. 42 and 43. As shown in FIGS. 42 and 43, it can be appreciated that the pattern collapse on the surface of the wafer W1 is suppressed to a substantially equal level in evaluation tests 11-1 and 11-2. Thus, it is considered that, if the substrate is relatively large as mentioned above and if the water repellency of the resist film is high, it is effective to use the second processing method.

According to the present disclosure, a liquid that has a relatively small surface tension and that is less likely to percolate into the wall portions defining the patterns is used as the replacing liquid for replacing the cleaning liquid. When drying the substrate, the dry region formed by supplying a gas to the central portion of the rotating substrate is expanded to the peripheral edge portion of the substrate, thereby preventing the replacing liquid from remaining on the surface of the substrate. This suppresses the collapse of the wall portions and the change in the line width of the patterns.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
supplying a developing liquid to a surface of an exposed substrate so as to form a resist pattern;
supplying a cleaning liquid to the surface of the substrate so as to remove a residue generated in the developing step from the substrate;
supplying a replacing liquid to the surface of the substrate so as to replace the cleaning liquid existing on the substrate with the replacing liquid, the replacing liquid having a surface tension of 50 mN/m or less and containing a percolation inhibitor for restraining the replacing liquid from percolating into a resist wall portion constituting the resist pattern; and
forming a dry region by supplying a gas to a central portion of the substrate while rotating the substrate so as to dry the surface of the substrate by expanding the dry region to a peripheral edge portion of the substrate with a centrifugal force, wherein forming the dry region comprises: rotating the substrate at a first revolution number when the gas is supplied to the central portion of the substrate; and then rotating the substrate at a second revolution number lower than the first revolution number until the dry region reaches the peripheral edge portion of the substrate.

2. The method of claim 1, wherein the percolation inhibitor is a basic nitrogen compound.

3. The method of claim 1, wherein supplying the cleaning liquid comprises: supplying the cleaning liquid to the central portion of the substrate; and rotating the substrate at a third revolution number so as to spread the cleaning liquid to the peripheral edge portion of the substrate with a centrifugal force, and wherein supplying the replacing liquid comprises: supplying the replacing liquid to the central portion of the substrate; and rotating the substrate at a fourth revolution number higher than the third revolution number so as to spread the replacing liquid to the peripheral edge portion of the substrate with a centrifugal force.

4. The method of claim 1, wherein the first revolution number is from 1500 rpm to 2500 rpm.

5. The method of claim 1, wherein the second revolution number is 1500 rpm or more and less than the first revolution number.

6. The method of claim 1, further comprising:
supplying a gas to a position of the dry region spaced apart from the central portion of the substrate after the dry region is formed.

7. A substrate processing apparatus, comprising:
a holding unit configured to hold a substrate provided with a developed resist pattern on a surface thereof and to rotate the substrate around a vertical axis;
a cleaning liquid supply unit configured to supply a cleaning liquid to the surface of the substrate;
a replacing liquid supply unit configured to supply to the surface of the substrate a replacing liquid which has a surface tension of 50 mN/m or less and contains a percolation inhibitor for restraining the replacing liquid from percolating into a resist wall portion constituting the resist pattern;
a gas supply unit configured to supply a gas to a central portion of the substrate; and
a control unit configured to output control signals so as to control operations of the holding unit, the cleaning liquid supply unit, the replacing liquid supply unit and the gas supply unit,
wherein the control unit is configured to output control signals so as to perform supplying the cleaning liquid to the surface of the substrate in order to remove a residue generated in a developing process, supplying the replacing liquid to the surface of the substrate in order to replace the cleaning liquid existing on the surface of the substrate with the replacing liquid, forming a dry region by supplying a gas to the central portion of the substrate while rotating the substrate, and drying the surface of the substrate by expanding the dry region to a peripheral edge portion of the substrate with a centrifugal force, and
wherein the control unit is further configured to output control signals so as to perform rotating the substrate at a first revolution number when the gas is supplied to the central portion of the substrate and then rotating the substrate at a second revolution number lower than the first revolution number until the dry region reaches the peripheral edge portion of the substrate.

8. The apparatus of claim 7, wherein the cleaning liquid supply unit is configured to supply the cleaning liquid to the central portion of the substrate, the replacing liquid supply unit is configured to supply the replacing liquid to the central portion of the substrate, and the control unit is configured to output control signals so as to perform rotating the substrate at a third revolution number in order to spread the cleaning liquid to the peripheral edge portion of the substrate with a centrifugal force and perform rotating the substrate at a fourth revolution number higher than the third revolution number in order to spread the replacing liquid to the peripheral edge portion of the substrate with a centrifugal force.

9. A non-transitory storage medium which stores a computer program for use in a substrate processing apparatus configured to clean a substrate provided with a developed and patterned resist film on a surface thereof, the program causing the computer to perform the substrate processing method of claim 1.

* * * * *